United States Patent
Sirbuly et al.

(10) Patent No.: US 8,344,597 B2
(45) Date of Patent: Jan. 1, 2013

(54) MATRIX-ASSISTED ENERGY CONVERSION IN NANOSTRUCTURED PIEZOELECTRIC ARRAYS

(75) Inventors: Donald J. Sirbuly, Carlsbad, CA (US); Xianying Wang, Shanghai (CN); Yinmin Wang, Tracy, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 12/970,727

(22) Filed: Dec. 16, 2010

(65) Prior Publication Data

US 2011/0163636 A1 Jul. 7, 2011

Related U.S. Application Data

(63) Continuation-in-part of application No. PCT/US2010/053827, filed on Oct. 22, 2010.

(60) Provisional application No. 61/286,861, filed on Dec. 16, 2009, provisional application No. 61/253,890, filed on Oct. 22, 2009, provisional application No. 61/255,571, filed on Oct. 28, 2009, provisional application No. 61/286,858, filed on Dec. 16, 2009.

(51) Int. Cl.
    *H01L 41/113* (2006.01)
(52) U.S. Cl. ..................... 310/339; 136/205
(58) Field of Classification Search ............. 310/339; 136/205

See application file for complete search history.

(56) References Cited

U.S. PATENT DOCUMENTS

| 7,148,579 | B2 * | 12/2006 | Pinkerton et al. | 290/1 R |
| 8,110,898 | B2 * | 2/2012 | Lewis et al. | 257/618 |
| 2008/0017356 | A1 * | 1/2008 | Gruss et al. | 165/104.33 |
| 2008/0292840 | A1 * | 11/2008 | Majumdar et al. | 428/114 |
| 2009/0057839 | A1 * | 3/2009 | Lewis et al. | 257/618 |
| 2009/0060788 | A1 * | 3/2009 | Ricoul et al. | 422/68.1 |
| 2010/0078066 | A1 * | 4/2010 | Darling et al. | 136/256 |
| 2010/0141095 | A1 * | 6/2010 | Park | 310/339 |
| 2010/0253184 | A1 * | 10/2010 | Choi et al. | 310/339 |
| 2010/0294976 | A1 * | 11/2010 | Ajayan et al. | 252/62.9 PZ |

FOREIGN PATENT DOCUMENTS

DE 102008011908 A1 * 2/2008
WO WO-2010131820 A1 * 11/2010

* cited by examiner

*Primary Examiner* — Thomas Dougherty
(74) *Attorney, Agent, or Firm* — O'Banion & Ritchey LLP

(57) ABSTRACT

A nanoconverter is capable of directly generating electricity through a nanostructure embedded in a polymer layer experiencing differential thermal expansion in a stress transfer zone. High surface-to-volume ratio semiconductor nanowires or nanotubes (such as ZnO, silicon, carbon, etc.) are grown either aligned or substantially vertically aligned on a substrate. The resulting nanoforest is then embedded with the polymer layer, which transfers stress to the nanostructures in the stress transfer zone, thereby creating a nanostructure voltage output due to the piezoelectric effect acting on the nanostructure. Electrodes attached at both ends of the nanostructures generate output power at densities of ~20 nW/cm$^2$ with heating temperatures of ~65° C. Nanoconverters arrayed in a series parallel arrangement may be constructed in planar, stacked, or rolled arrays to supply power to nano- and microdevices without use of external batteries.

31 Claims, 17 Drawing Sheets

MATRIX-ASSISTED ENERGY CONVERSION IN NANOSTRUCTURED PIEZOELECTRIC ARRAYS

CROSS-REFERENCE TO RELATED APPLICATIONS

This application is a nonprovisional of, and claims priority to, U.S. provisional patent application Ser. No. 61/286,861 filed on Dec. 16, 2009, incorporated herein by reference in its entirety. This application is a 35 U.S.C. §111(a) continuation-in-part of, and claims priority to, PCT international application number PCT/US10/53827 filed on Oct. 22, 2010, incorporated herein by reference in its entirety, which is a nonprovisional of, and claims priority to, U.S. provisional patent application Ser. No. 61/253,890 filed on Oct. 22, 2009, incorporated herein by reference in its entirety, U.S. provisional patent application Ser. No. 61/255,571 filed on Oct. 28, 2009, incorporated herein by reference in its entirety, and U.S. provisional patent application Ser. No. 61/286,858 filed on Dec. 16, 2009, incorporated herein by reference in its entirety.

STATEMENT REGARDING FEDERALLY SPONSORED RESEARCH OR DEVELOPMENT

The United States Government has rights in this invention pursuant to Contract No. DE-AC52-06NA27344 between the U.S. Department of Energy and Lawrence Livermore National Security, LLC, for the operation of Lawrence Livermore National Laboratory.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to nanoscale power generation (or a nanoconverter), more particularly to nanodevice power generation from thermal energy, and still more particularly to power generation through differential thermal expansion of a polymeric matrix exerting forces on nanoscale components.

2. Description of Related Art

In a complex environment, there exists a variety of energy sources, such as mechanical energy, solar energy, and thermal energy. In additional to these "traditional" energy sources, there are other types of energy sources. For example, molecules contain chemical energy. When interacting with certain types of materials, molecules can either be decomposed (through catalytic activities) or directly interact with semiconductor surfaces through charge-transfer or dipole-interactions. Both processes provide a new mechanism to generate potentials inside materials and thus electric-current and voltage.

The treatise, *Introduction to Nanotechnology*, by Charles P. Poole, Jr., and Frank J. Owens, John Wiley &. Sons, 2003, states: "Nanotechnology is based on the recognition that particles less than the size of 100 nanometers (a nanometer is a billionth of a meter) impart to nanostructures built from them new properties and behavior. This happens because particles which are smaller than the characteristic lengths associated with particular phenomena often display new chemistry and physics, leading to new behavior which depends on the size. So, for example, the electronic structure, conductivity, reactivity, melting temperature, and mechanical properties have all been observed to change when particles become smaller than a critical size."

BRIEF SUMMARY OF THE INVENTION

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a nanoconverter system that will directly generate electricity through application of heat. High surface-to-volume ratio semiconductor nanowires or nanotubes (such as ZnO, silicon, carbon nanotubes, etc.) are grown either aligned (typically substantially vertically, without limitation) or substantially vertically aligned on a substrate. Epoxy or other types of insulators are used to embed nanowires or nanotubes in a polymer layer to form a nanoconverter. The subsequent exposure of heat to the polymer layer causes the nanowires or nanotubes to differentially thermally expand, thereby allowing the nanoconverter to generate an electric current based on the piezoelectric effect.

An aspect of the invention is a nanoconverter, comprising: one or more nanostructures comprising a top end and a bottom end, wherein the nanostructures are at least partially embedded within a polymer layer; and means for generating power from the nanostructures. The means for generating power may comprise: a bottom electrode disposed on bottom end of one or more of the nanostructures; and a polymer layer into which the nanostructures are embedded. The means for generating power may also comprise: a top electrode electrically connected to one or more of the nanostructures at the nanostructure top end.

The nanostructures above may be selected from the group of nanocomponents consisting of: a nanotube, a nanowire, a nanosheet, and a nanoribbon. The nanostructures may be selected from the group of nanostructures consisting of: a ZnO nanowire, a silicon nanowire, a carbon nanotube, and a semiconductor nanostructure. The nanostructures may be aligned, or substantially vertically aligned.

The means for generating power further may further comprise a heat source applied to the polymer layer. The heat source may be selected from the group of heat sources consisting of: an exhalation, a combustion source, an electronic source, a solar source, and a biological oxidation source. The exhalation may originate from the group of exhalants consisting of: human breath, non-human animal breath, bacterial outgas, and plant outgas; and the biological oxidation may originate from the group of biological oxidizers consisting of: human metabolism, non-human metabolism, bacterial metabolism, and plant metabolism.

The polymer layer in the invention above may comprise a coefficient of thermal expansion selected from the group of thermal expansions consisting of: $\geq 40 \times 10^{-6}/°K$, $\geq 50 \times 10^{-6}/°K$, $\geq 60 \times 10^{-6}/°K$, $\geq 70 \times 10^{-6}/°K$, and $\geq 80 \times 10^{-6}/°K$. Additionally, a ratio may be formed of a coefficient of thermal expansion of the polymer layer divided by a coefficient of thermal expansion of the nanostructure comprises a ratio selected from the group of ratios consisting of: $\geq 2.000$, $\geq 3.000$, $\geq 4.000$, $\geq 5.000$, $\geq 6.000$, $\geq 7.000$, $\geq 8.000$, $\geq 9.000$, and $\geq 10.000$. The coefficient of thermal expansion nanostructure may be taken from a c-axis of the nanostructure.

An array of one or more nanoconverters above may form a nanoconverter array, arranged to generate a specified current and voltage output when supplied with a heat source. The heat source may be at a temperature between an initial fabrication temperature of the polymer layer and a glass transition temperature Tg of the glass layer.

The nanoconverter may operate as a nanosensor to detect a temperature by generation of a voltage when the temperature is applied to the polymer layer.

An environmental sealant may be applied to the top end of the nanostructure to prevent environmental degradation.

In the nanoconverter array above, the means for generating power may generate output power for one or more of the group of devices consisting of: a cell phone, a smart phone, a glucose monitor, a pacemaker, a therapeutic or diagnostic device, a drug delivery device, an insulin pump, a left ventricular assist device, a pacemaker, a cardioverter defibrillator, or a artificial muscle device, a cochlear implant, a batteryless device, a powered nanomachine, and an artificial vision device.

Additionally, the means for generating power above may generate output power for an insulin control system, said insulin control system comprising: a nanosensor glucose monitor that produces a voltage proportional to a glucose molecule concentration; a controller that senses the nanosensor glucose monitor voltage; and an insulin pump controlled by the controller whereby insulin is disseminated when the nanosensor glucose monitor voltage is exceeded.

In the nanoconverter above, the polymer layer may be selected from the group of polymers consisting of: epoxy, polydimethylsiloxane (PDMS), and poly(vinyl chloride-co-vinyl-co-2-hydroxypropyl acrylate) (PVC).

In the nanoconverter above, a top electrode may electrically connect to the nanostructure at the nanostructure top end; and a bottom electrode may electrically connect to the nanostructure at the nanostructure bottom end.

In another aspect of the invention, a nanoconverter apparatus, may comprise: a nanostructure with top and bottom ends; a top electrode electrically connected to the top end; a polymer layer that surrounds at least a portion of the nanostructure, wherein the surrounded portion of the nanostructure forms a stress transfer zone; a bottom electrode electrically connected to the nanostructure at the bottom end of the nanostructure, wherein the nanostructure generates a piezoelectric voltage and a current when the polymer layer exerts a stress on the nanostructure in the stress transfer zone. The nanostructure may be selected from the group of nanocomponents consisting of: a nanotube, a nanowire, a nanosheet, and a nanoribbon. Additionally, the nanostructure may be selected from the group of nanostructures consisting of: a ZnO nanowire, a silicon nanowire, a carbon nanotube, and a semiconductor nanostructure.

In the invention above, the nanostructure may be an element of an aligned or substantially vertically aligned forest of nanostructures. The nanostructure may generate the piezoelectric voltage and the current through stress induced on the nanostructure by the polymer layer in the stress transfer zone.

The polymer layer exerts the stress induced on the nanostructure from a heat source comprising an exhalation. The exhalation may originate from the group of exhalants consisting of: human breath, non-human animal breath, bacterial outgases, and plant outgases.

A nanoconverter array may comprise an array of one or more nanoconverters above wherein the nanoconverters are arranged to generate a specified current output and voltage output when a heat source is supplied to the polymer layers of the nanoconverters.

The nanoconverter array may operate as a nanosensor to detect a temperature by generation of the piezoelectric voltage output. The nanostructure generated piezoelectric voltage and current may output power to one or more of the group of devices consisting of: a cell phone, a smart phone, a glucose monitor, a pacemaker, a therapeutic or diagnostic device, a drug delivery device, an insulin pump, a left ventricular assist device, a pacemaker, a cardioverter defibrillator, or a artificial muscle device, a cochlear implant, a batteryless device, a powered nanomachine, a smart phone, a calculator, a wrist watch, a standalone sensor, a sensor in a network, and an artificial vision device.

In another aspect of the invention, the nanostructure generated piezoelectric voltage and current may power: an insulin control system, said insulin control system comprising: a nanosensor glucose monitor that produces a voltage proportional to a glucose molecule concentration; a controller that senses the nanosensor glucose monitor voltage; and an insulin pump controlled by the controller whereby insulin is disseminated when the nanosensor glucose monitor voltage is exceeded.

In the nanoconverters above, the polymer layer may be selected from the group of polymers consisting of: epoxy, polydimethylsiloxane (PDMS), and poly(vinyl chloride-co-vinyl-co-2-hydroxypropyl acrylate) (PVC).

In still another aspect of the invention, a method of constructing a nanoconverter may comprise: providing a substrate; growing one or more nanostructures on the substrate, while growing a bottom electrode on the substrate, wherein the bottom electrode is electrically connected with one or more of the nanostructures; surrounding one or more of the nanostructures with a polymer layer to form a stress transfer zone around the nanostructures; selectively etching the polymer layer around the nanostructures to form a top end of the nanostructure exposed above the etched polymer layer; and electrically connecting the nanostructures at the top end and the bottom electrode, wherein the two ends have disposed between them the stress transfer zone. The method of constructing the nanoconverter may further comprise: exposing the polymer layer to a heat source, thereby generating electrical power through thermal expansion of the polymer layer transferring stresses to the nanostructures in the stress transfer zone.

In the method of constructing the nanoconverter above, the nanostructures may be selected from the group of nanocomponents consisting of: a nanotube, a nanowire, a nanosheet, and a nanoribbon. The nanostructures may be selected from the group of nanostructures consisting of: a ZnO nanowire, a silicon nanowire, a carbon nanotube, and a semiconductor nanostructure. Such nanostructures may be aligned or substantially vertically aligned.

In all of the nanoconverters above, the nanostructures generate the electrical power through a piezoelectric effect of stressing the nanostructures in the stress transfer zone.

In the method above, the heat source may originate from a source consisting of an exhalation. Such exhalation may originate from the group of exhalants consisting of: human breath, non-human animal breath, bacterial outgases, and plant outgases.

A nanoconverter array may be comprised of an array of one or more nanoconverters constructed according to the above method, wherein the nanoconverter array is arranged to generate a specified current output and voltage output when supplied with a heat source applied to the polymer layer. Further, a nanosensor may comprise: a nanoconverter constructed according to the method above; wherein the nanoconverter operates as a nanosensor to detect a temperature applied to the polymer layer by generating a nanoconverter voltage output.

The nanoconverter array above may have its generated specified current output and voltage output to one or more of the group of devices consisting of: a cell phone, a smart phone, a glucose monitor, a pacemaker, a therapeutic or diagnostic device, a drug delivery device, an insulin pump, a left ventricular assist device, a cardioverter defibrillator, an artificial muscle device, a cochlear implant, a batteryless device, a powered nanomachine, and an artificial vision device.

The nanoconverter array above may have its generated specified current output and voltage output to an insulin control system, said insulin control system comprising: a nanosensor glucose monitor that produces a sensor voltage proportional to a glucose molecule concentration; a controller that senses the sensor voltage; and an insulin pump controlled by the controller whereby insulin is disseminated when the sensor voltage exceeds a preset level.

In the method above, the polymer layer may be selected from the group of sealants consisting of: epoxy, polydimethylsiloxane (PDMS), and poly(vinyl chloride-co-vinyl-co-2-hydroxypropyl acrylate) (PVC).

In yet another aspect of the invention, a nanoconverter may comprise: a nanostructure; and means for generating power from the nanostructure. The means for generating power from the nanostructure may comprise: a polymer layer adhered to the nanostructure in a stress transfer zone; wherein the nanostructure is stressed by the polymer layer in the stress transfer zone to piezoelectrically generate power from the nanostructure.

In yet another aspect of the invention, a nanoconverter may comprise a nanostructure that interacts with a polymer layer in a stress transfer zone to generate power through a piezoelectric effect. A device may be powered by such nanoconverter, wherein the device has no other power source.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWINGS

The invention will be more fully understood by reference to the following drawings which are for illustrative purposes only.

DETAILED DESCRIPTION OF THE INVENTION

Definitions

Figure 1A:
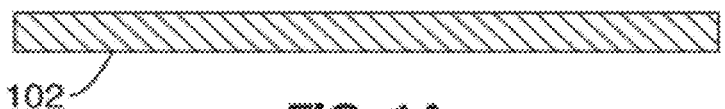
FIG. 1A is a cross section of a substrate for building a nanoconverter.

The following definitions are provided to facilitate an understanding of the terminology used herein. It is intended that those terms not present in these Definitions be given their plain meaning as understood by those persons having ordinary skill in the art.

"Nanoconverter" means a device comprising nanoscale components that generates power when exposed to a thermal heat source or mechanical excitation. Such power generation is, without limitation, generally due to polymer stresses that induce a piezoelectric response in the bulk nanostructure (typically ZnO nanowires).

"Nanodevice" means a device comprising a nanoconverter, a nanosensor, or other nanoscale component.

"Nanosensor" means a device comprising nanoscale components that generates an electrical signal when exposed to a thermal gradient. Such electrical signal generation is, without limitation, generally due to surface the piezoelectric response of nanowires embedded in a polymer layer. While the nanosensor and nanoconverter may be identical in some applications, their intended use may be different when used as a detective device, or as a power source.

"Nanostructure" means an object of intermediate size between molecular and microscopic (micrometer-sized) structures. In describing nanostructures at least one of the dimensions describing the structure is on the nanoscale, i.e., a size between 0.1 and 100 nm. Nanotubes or nanowires have two dimensions on the nanoscale, i.e., the diameter of the tube or wire is between 0.1 and 100 nm; its length could be much greater. Typical nanostructures include, but are not limited to: nanowire, nanosheets, nanotubes, nanotubes, nanoribbon, nanocages, nanofabrics, nanoflakes, and quantum dots.

"Vertically aligned" means a forest of nanowires or nanotubes that are more or less perpendicular to a substrate. Such nanowires or nanotubes are not restricted to being perfectly orthogonal to a substrate.

Introduction

Encouraging progress has been made recently in the development of nanowire (NW)-based piezoelectric nanoconverters. In fact, exciting results from devices based on ZnO, poly(vinylidene fluoride) (PVDF), barium titanate ($BaTiO_3$), and lead zirconate titanate (PZT) have shown device architectures with different powering modes including alternating current (AC) and direct current (DC). One key limitation, however, of many piezoelectric-based nanoconverters is a requirement for mechanical energy sources (e.g., mechanical vibration or motion) to generate electrical power. This severely restricts the applicability of these nanodevices in a general environment where a direct mechanical energy source might not be available.

To activate the motion of nanopiezoelectric materials through alternate energy sources, such as thermal, photonic, or chemical, it is crucial to investigate new methods of coupling the piezoelectric transducers directly to media that can convert a nonmechanical energy source into piezoelectric strain. This will enable materials to be submersed in a variety of environments that have both nontraditional power sources such as mechanical vibrations, motion, and pressure gradients as well as traditional power sources such as light, heat, and chemical.

Here, a self-powered platform is disclosed that relies on the differential thermal expansion response of a polymeric film to drive a piezoelectric effect in a nanowire array. To test the concept of polymer facilitated mechanical-to-electrical conversion, it was decided to use the well-reported ZnO nanowire array system that can be grown by different routes (including chemical vapor deposition or solution-based techniques) and embed the nanowire array in an environmental-responsive organic polymer. In comparison to other ZnO nanowire-based nanoconverters, the deformation of the ZnO nanowires in the devices discussed here are not directly induced by external forces, but rather are caused by a shape change in the polymer matrix as it responds to external stimuli through expansion. With this hybrid approach, the nanowires are near uniformly distributed in a forest inside the polymer matrix and can deform collectively under stimulation, whereby each individual piezoelectric transducer contributes power to the overall device.

Using a thermal energy source as the test stimulant, it has been demonstrated that DC electric currents can be generated by the expansion of the polymer matrix with simple and cheap device architectures. In addition, since the platform discussed here utilizes matrix-assisted mechanical-to-electrical conversion, energy-harvesting structures may be designed that are tuned to scavenge energy from a variety of sources including light, heat, pressure, chemical, and mechanical.

Nanoconverter Construction

Refer now to FIGS. 1A thru 1E, which are cross sections illustrating the cumulative basic steps of construction of a nanoconverter 100 of the present invention. FIG. 1A shows the substrate 102 upon which the vertically aligned (n-type) ZnO nanowires 104 will be grown. In this case the substrate 102 is a 2 mm×2 mm a-plane sapphire substrate. Other substrates including, but not limited to, SiC, silicon, glass, etc. may be used.

Figure 1B:
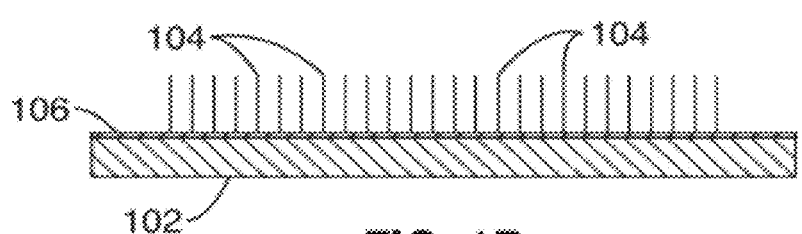
FIG. 1B is a cross section of the substrate of FIG. 1A with vertically aligned ZnO nanowires formed atop the substrate.

FIG. 1B shows a forest of epitaxially grown vertically aligned ZnO-nanowires 104 that have been grown on the sapphire substrate 102. The vertically aligned epitaxially grown ZnO nanowires 104 were grown via a chemical vapor transport and condensation process or other method resulting in such vertically aligned nanowires 104. At the same that the vertically aligned ZnO nanowires 104 are grown, a thin layer of ZnO forms on the substrate 102, which will subsequently become a bottom electrode 106 of the nanoconverter 100.

Figure 1C:
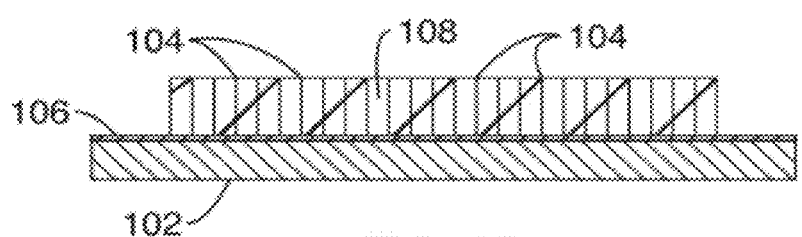
FIG. 1C is a cross section of the vertically aligned ZnO nanowires formed on the substrate of FIG. 1B, where the nanowires have been drop cast with a polymer layer such as PVC or other electrical insulator.

FIG. 1C shows the vertically aligned ZnO nanowires 104 after they have been embedded in an environmental-responsive polymer poly-(vinylchloride-co-vinylacetate-co-2-hydroxypropylacrylate) (PVC) by drop casting a 1% PVC solution (in 1,4-dioxane) on the substrate 102. The physical and mechanical properties of PVC polymers allow for room temperature formation of uniform, flexible thin films. The polymer layer 108 at this stage completely covers the vertically aligned ZnO nanowires 104.

Figure 1D:
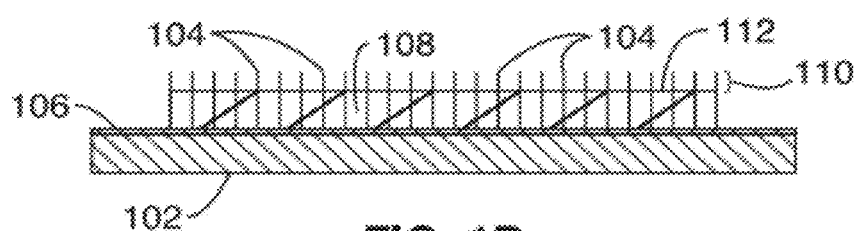
FIG. 1D is a cross section of the device of FIG. 1C, where a top layer of the polymer layer has been oxygen etched for removal.

FIG. 1D shows that after curing the PVC film at room temperature, the top surface was oxygen plasma etched to clean and expose the vertically aligned nanowire 104 tips 110, leaving a cleaned plateau 112 below the tips 110. This cleaned plateau 112 is comprised of the polymer layer 108 of the previous FIG. 1C. The polymer layer 108 is generally impermeable to desired molecules, creating a molecule noninteraction zone for nanowires immersed and sealed within the polymer layer 108. A scanning electron microscopy image after the etching step will show the exposed nanowire tips 110 (which are ~0.1-0.5 μm long). The nanowire density is measured at ~15/μm².

Figure 1E:
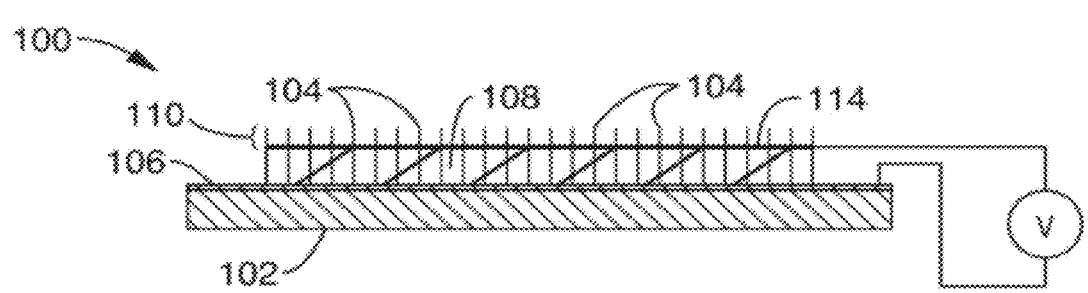
FIG. 1E is a cross section of the device of FIG. 1D, where a Au/Ti layer has been deposited over the oxygen etched polymer layer to form a top electrode.

FIG. 1E shows that a 200 μm Au/5 nm Ti layer deposited via electron beam evaporation has been deposited on the exposed nanowire tips 108. This Au/Ti layer forms the top electrode 114 in the nanoconverter 100.

For longevity of the device, the exposed tips of the nanowires 110 may be sealed to prevent environment degradation (not shown here).

Nanoconverter Operation

Electric voltage and current are generated when a thermal gradient is placed across the layer 108. The thermal gradient produces a thermal expansion of the layer 108 that is preferably different than the substrate 102, resulting in piezoelectric power generation from the mechanical stresses induced in the ZnO nanowires 104.

The nanoconverter 100 is connected by electrical leads to an external device 202 that will be powered by the nanoconverter 100. The external device 202 can be a device that provides a therapeutic or diagnostic function. For example, the device 202 in one embodiment may be a glucose monitor. The device 202 in another embodiment may be a pacemaker. The device 202 in another embodiment may be a device enabling drug delivery. The device 202 in another embodiment may be an insulin pump. The device 202 in another embodiment may be a left ventricular assist device. The device 202 in another embodiment may be a cardioverter defibrillator. The device 202 may be used to power other embodiments are devices for artificial muscles, artificial vision, and any such device that requires electrical power sources for operation. The generated electricity may also be directly stored in a battery.

Nanoconverter System for Producing Power Using Human Breath

Figure 2A:
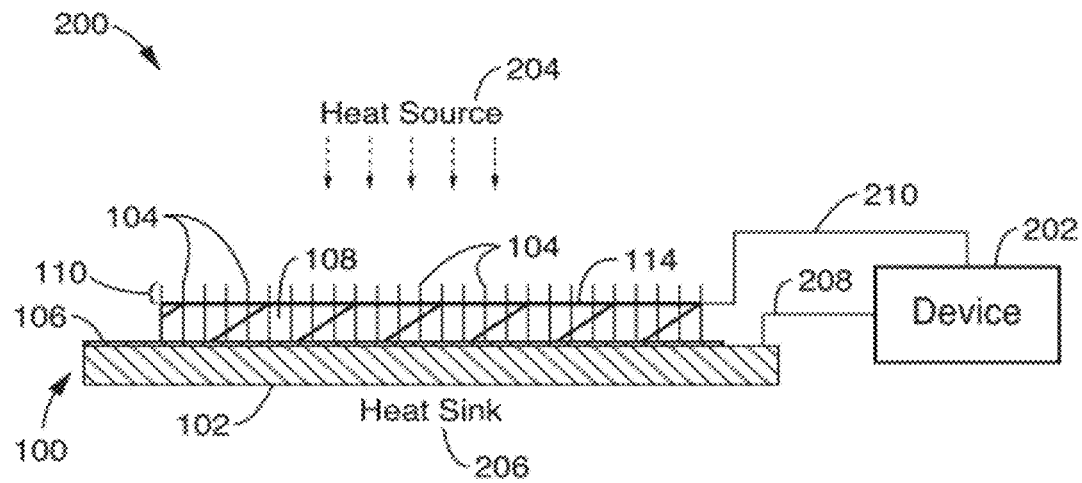
FIG. 2A is a cross section of the nanoconverter of FIG. 1E connected by electrical leads to an external device that is powered by the nanoconverter after the nanoconverter has been exposed to a heat source.

Refer now to FIG. 2A, which is a cross section of the nanoconverter 100 system 200 of FIG. 1E connected by electrical leads to an external device 202 that is powered by the nanoconverter 100 that is exposed to differential temperatures as a result of a heat source 204 and a heat sink 206, forming a thermal gradient. Here, the nanoconverter 100 is electrically connected to the external device 202 by the bottom conductor 208 that attaches to the nanoconverter 100 bottom electrode 106 and the top conductor 210 that attaches to the nanoconverter 100 top electrode 114.

The external device 202 can be a device that provides a therapeutic or diagnostic function. For example, the device 202 in one embodiment may be a glucose monitor. The device 202 in another embodiment may be a pacemaker. The device 202 in another embodiment may be a device enabling drug delivery. The device 202 in another embodiment may be an insulin pump. The device 202 in another embodiment may be a left ventricular assist device. The device 202 in another embodiment may be a cardioverter defibrillator. The device 202 may be used to power other embodiments are devices for artificial muscles, artificial vision, and any such device that requires electrical power sources for operation. The generated electricity may also be directly stored in a battery.

Figure 2B:
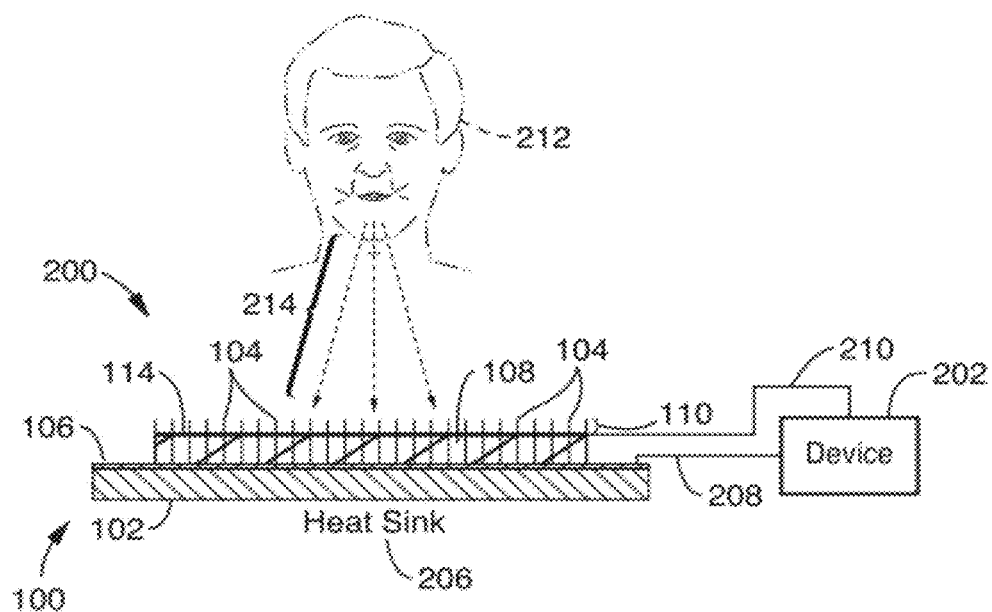
FIG. 2B is a cross section of the nanoconverter of FIG. 1E connected by electrical leads to an external device that is powered by the nanoconverter after the nanoconverter is breathed upon by a human or other living source to provide heat.

Refer now to FIG. 2B, which is a nanoconverter 100 system 200 of FIG. 2A for producing power using human breath, with the nanoconverter 100 shown in a cross sectional view. The nanoconverter 100 is the same as previously described in FIG. 2A, but instead of being powered by a relatively abstract thermal gradient in FIG. 2A, however, it is instead exposed to a human 212 or other living breath 214 stream. Electric voltage and current is generated when the nanoconverter experiences a thermal gradient, as previously shown in FIG. 2A. The nanoconverter 100 is electrically connected by bottom conductor 208 and top conductor 210 to an external device 202 that will be powered by the nanoconverter 100. The living breath 214 stream allows the nanoconverter 100 to generate an electric current and power the external device 202.

The external device 202 can be a cell phone or other device that uses electricity. The external device 202 can be a device that provides a therapeutic or diagnostic function. For example, the device 202 in one embodiment is a glucose monitor. The device 202 in another embodiment may be a pacemaker. The device 202 in another embodiment may be a device enabling drug delivery. The device 202 in another embodiment may be an insulin pump. The device 202 in another embodiment may be a left ventricular assist device. The device 202 in another embodiment may be cardioverter defibrillator. The device 202 in other embodiments may be devices for artificial muscles, artificial vision, and any such device that requires an electrical power source for operation.

Example Nanoconverter Embodiments

Figure 3A:
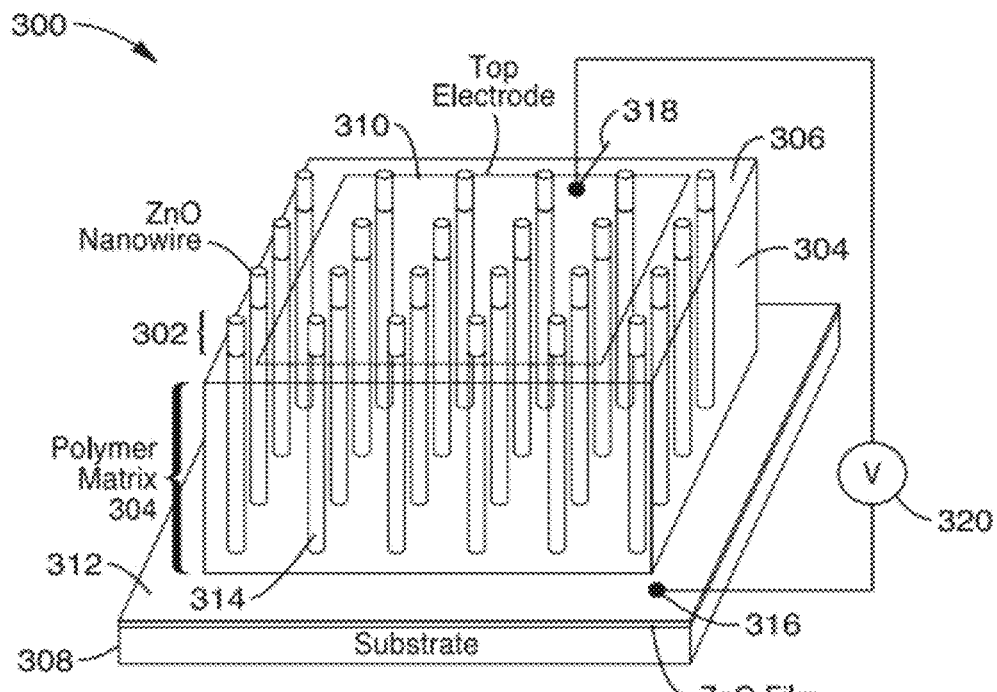
FIG. 3A is a perspective view of the ZnO-PVC polymer hybrid energy nanoconverter of FIG. 1E based on vertically aligned ZnO nanowires (NWs) embedded in a polymer matrix.

Refer now to FIG. 3A, which is a perspective view of a nanoconverter 300 based on vertically aligned ZnO nanowires embedded in a polymer matrix. This nanoconverter 300 was built to establish that electricity could be generated directly from a thermal gradient, which exists whenever there is heat flow. To extract energy from thermal gradients, either the Peltier effect of mechanical work is typically required. Such thermal gradients are ubiquitous in nature; one only need look at a sunny day with pockets of shade. Provided that the thermal gradients can also be applied to generate the storable and clean electricity, an abundant energy source could become available.

In this FIG. 3A, a perspective view is seen of the ZnO-PVC polymer hybrid energy nanoconverter 300 of FIG. 1E based on vertically aligned ZnO nanowires (NWs) embedded in a polymer matrix. Here, bare nanowire tips 302 extend above an etched polymer matrix 304 surface 306 to provide an electrical contact for the top end of the nanowire. Substrate 308 forms the mechanical base for the overall nanoconverter 300. A top electrode 310 is deposited on the etched polymer matrix 304 surface 306, thereby making electrical contact with the bare nanowire tips 302 within the region of the top electrode 310. A ZnO bottom electrode 312 is incidentally grown as a byproduct during growth of the ZnO nanowires 314. Electrical contacts may be attached to the ZnO bottom electrode 312 at bottom contact 316. Similarly, a top contact 318 may be attached to the top electrode 310. An output voltage 320 is then developed between the bottom electrode 312 and the top electrode 310, which may be used for testing or powering other devices.

The bottom contact 316 was manufactured by placing a silver paste on the underlying ZnO thin film bottom electrode 312 that formed during the epitaxial ZnO nanowire growth process. The electrical transport characteristics of the nanodevices were tested using a standard electrical probe station (Signatone S-1160) equipped with tungsten micromanipulator probes, a power source meter (Keithley 2602), and recording software.

Figure 3B:
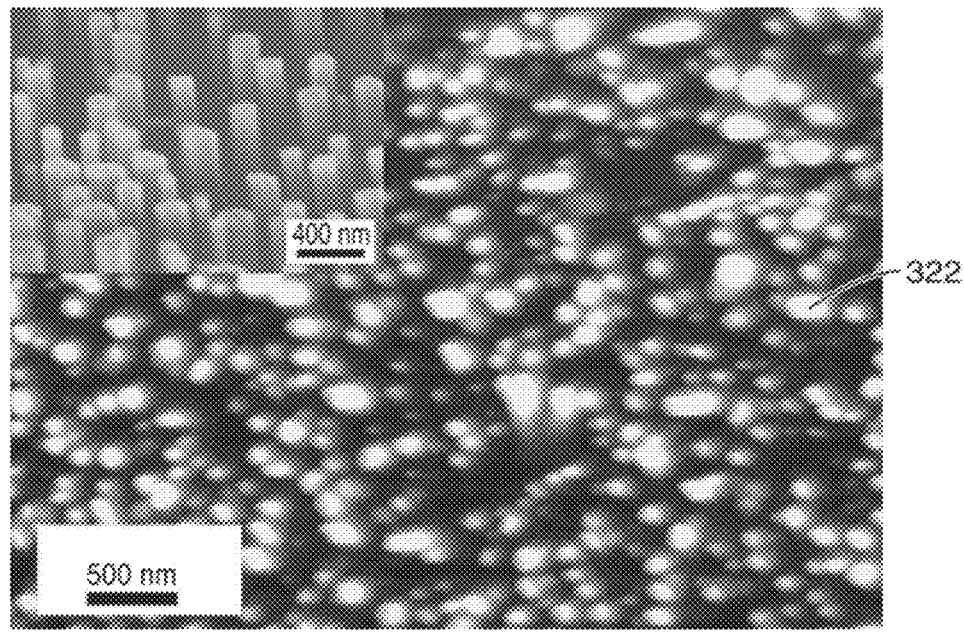
FIG. 3B is a top view scanning electron micrograph (SEM) of the as-grown ZnO nanowires on a sapphire substrate, with ZnO nanowire diameters ranging from 60-120 nm, lengths spanning up to 10 µm prior to drop casting with a PVC polymer, and a density of the nanowires at about $30/\mu m^2$ in the polymer layer, with an inset upper left portion at a 30° tilted view of the vertically aligned ZnO nanowires.

Refer now to FIG. 3B, which is a scanning electron micrograph (SEM) of the as-grown nanowire diameters ranging from 60-120 nm and lengths span between 7-10 μm. This SEM was taken prior to the drop casting of the polymer layer. The spacing between nanowires is on the order of ~180 nm (i.e., with an areal density of ~30 NWs/μm$^2$).

After epitaxial growth of the ZnO nanowires, the resulting nanowire forest is infiltrated by drop-casting with a poly (vinyl chloride-co-vinyl-co-2-hydroxypropyl acrylate) (PVC) polymer solution (in 1,4-dioxane) on the substrate, and subsequently etched in oxygen plasma so that ~5-10% of the nanowires' length is exposed for electric contacts as nanowire tips 322 and accessible for electrical contact. The physical and mechanical properties of PVC polymers allow for room temperature formation of uniform, flexible thin films. After drying the PVC film at room temperature, the top surface was oxygen plasma etched to clean and expose the nanowire tips for making electrical contact.

Figure 3C:
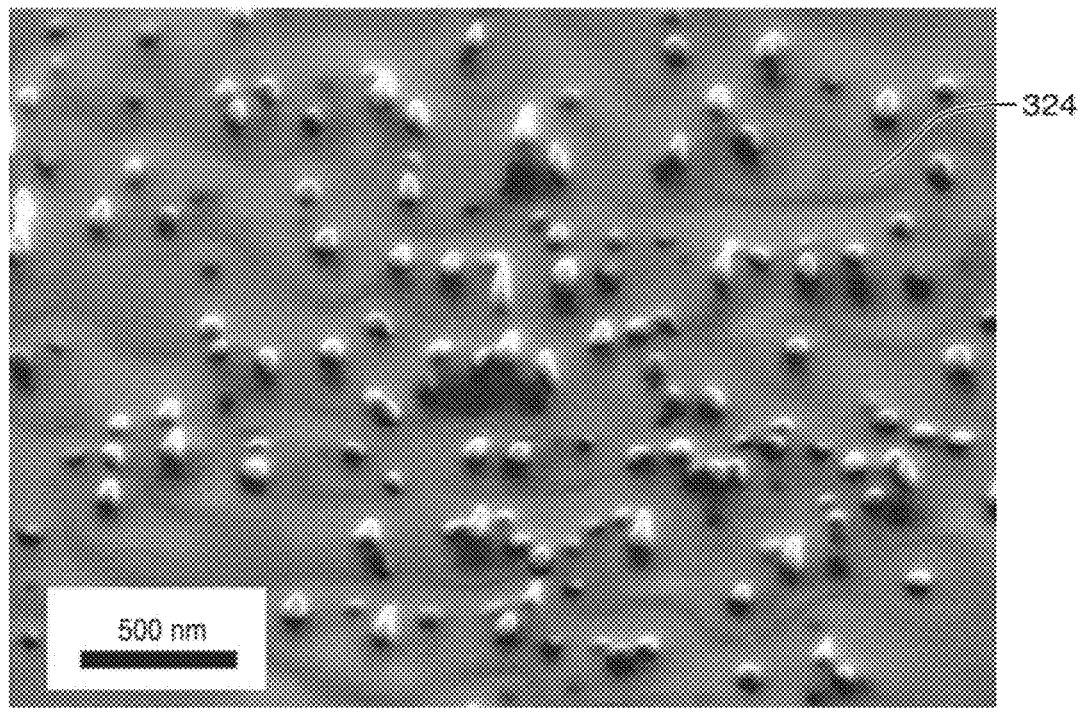
FIG. 3C is a scanning electron micrograph showing ZnO nanowire tips surrounded by an etched polymer layer after the nanowire array has been infiltrated with a polymer layer and oxygen plasma etched, showing that about 50% of the nanowires are exposed after plasma etching.

Refer now to FIG. 3C, which is a typical SEM image of the exposed nanowire tips 322 (~0.5 μm long). After etching back a portion of the PVC film, the nanowire density is measured at ~15/μm$^2$, leaving ~50% of the nanowires unexposed. A 200 nm Au/5 nm Ti top electrode 324 (~1 mm$^2$ contact area) was deposited via electron beam evaporation. While electron beam evaporation was used here, one could also use an adhesive metal paste as the electrical contact, insofar as the electrical contact function of the nanowire tips were not to be compromised. Such a metallic paste electrode 324 would be similar to that used for the bottom contact 314. Floating contacts that use pastes on both the top and bottom contacts appear much more reproducible, but are currently under further investigation.

Figure 4A:
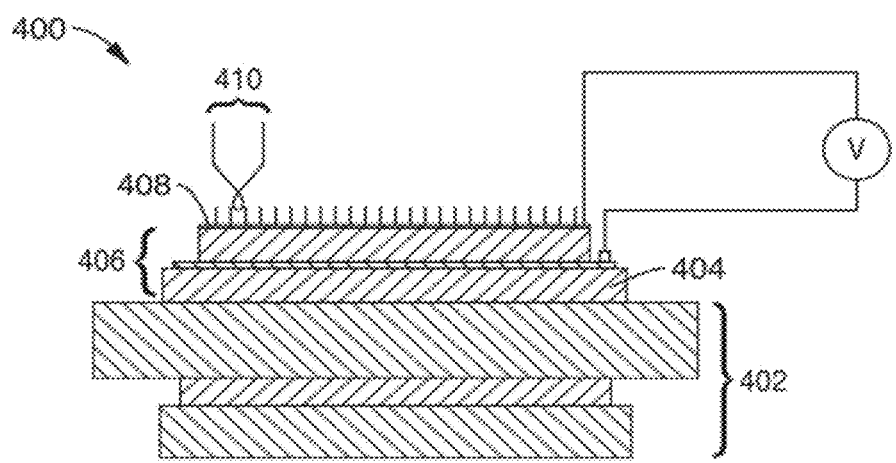
FIG. 4A is a nanoconverter thermal and electrical test setup.

Refer now to FIG. 4A, which is a nanoconverter test setup 400. For testing, a Peltier hot plate 402 was placed beneath the sapphire substrate 404 to thermally stimulate the nanoconverter device 406. To get a good approximation of the temperature on the top side 408 of the nanoconverter device 406 as a function of heating voltage, a small k-type thermocouple 408 was placed on the nanoconverter surface 410 and the temperature was recorded at various heating voltages. Leads 410 connect the thermocouple 408 to an external sensor (not shown here).

Figure 4B:
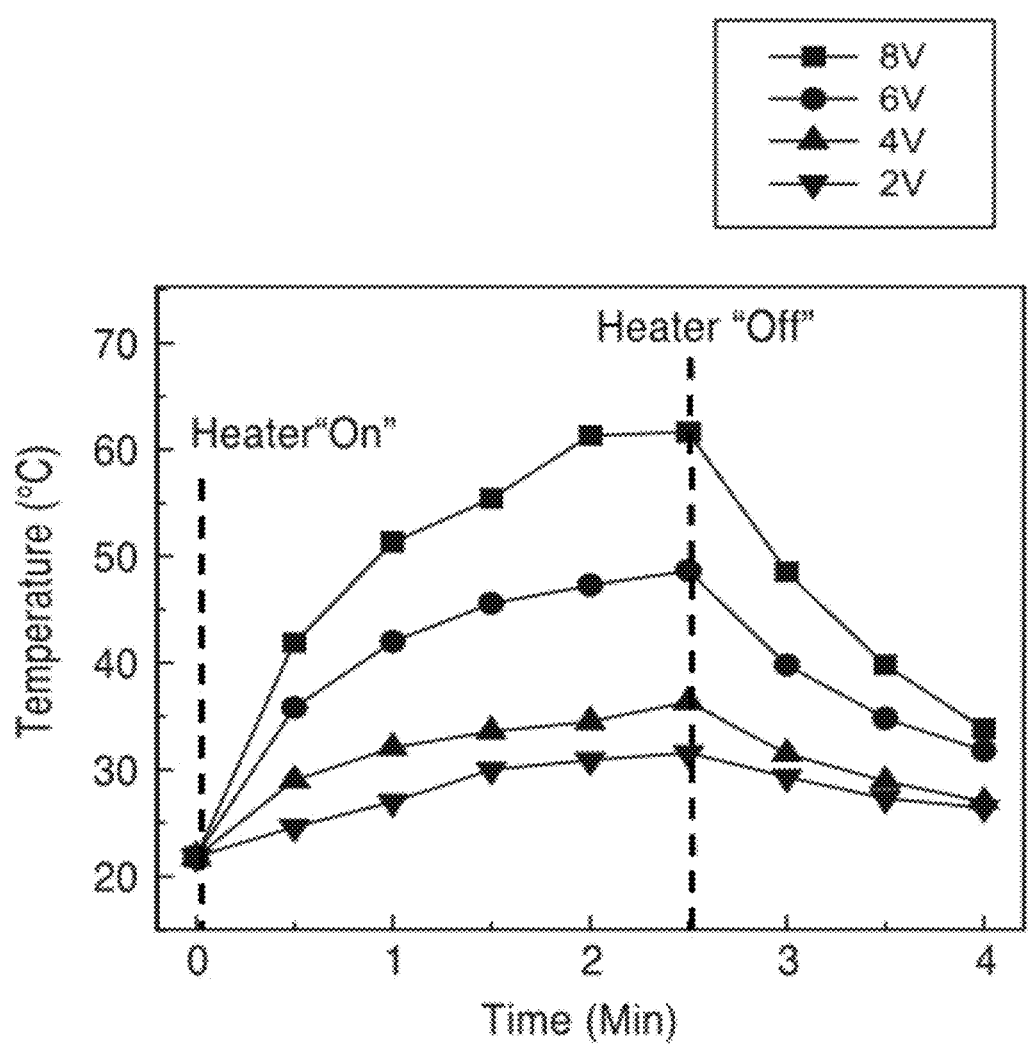
FIG. 4B is a graph of the voltage versus temperature curve for the nanoconverter device of FIG. 4A.

Refer now to FIG. 4B, which is a graph of the voltage versus temperature curve for the device of FIG. 4A. For testing, a Peltier hot plate was placed beneath the sapphire substrate to thermally stimulate the device. To get a good approximation of the temperature on the top side of the nanoconverter device as a function of heating voltage, a small k-type thermal couple was placed on the nanoconverter surface and the temperature was recorded at various heating voltages.

Figure 4C:
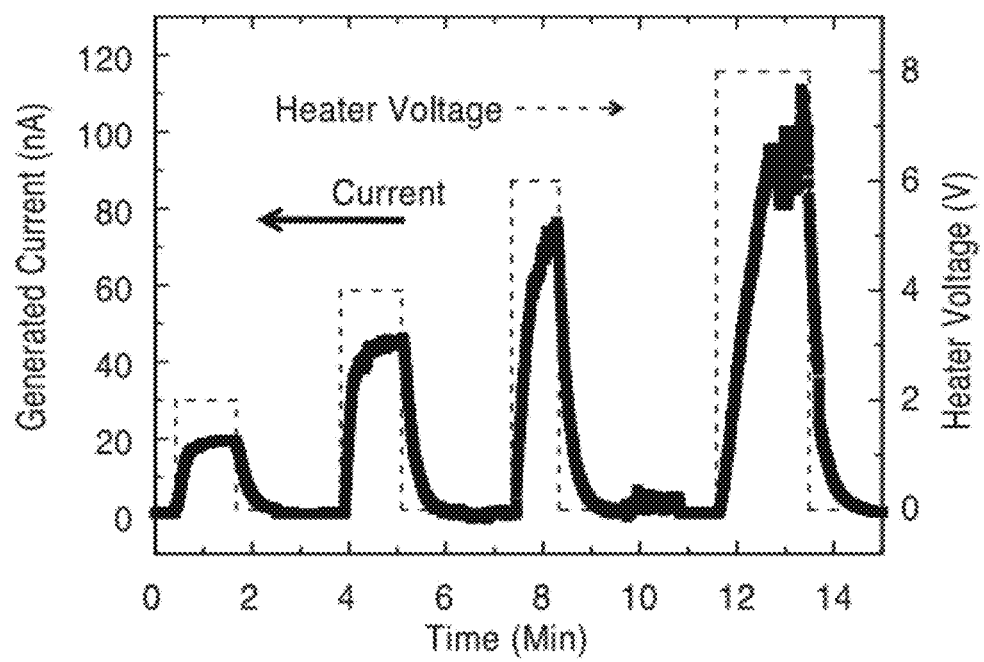
FIG. 4C is a graph of the nanoconverter output current versus time for various Peltier heater input voltages.

Refer now to FIG. 4C, which is a graph of the nanoconverter output current versus time for various Peltier heater input voltages. A strong short-circuit current on the order of tens of nanoamperes (nA) was observed from the nanoconverter at various heater temperatures.

Figure 4D:
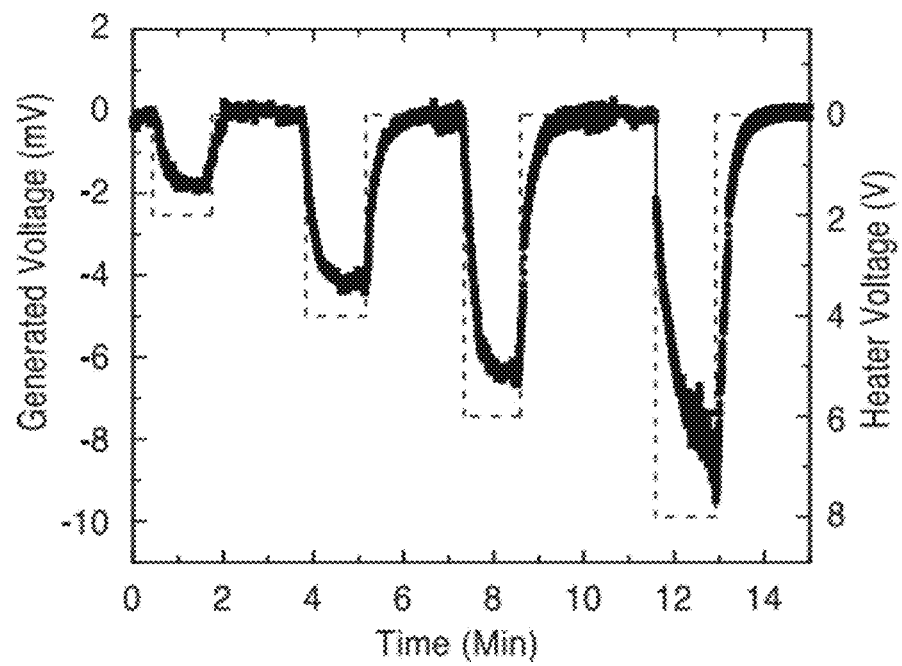
FIG. 4D is a graph of the nanoconverter output voltage versus time for various Peltier heater input voltages, with the heat source supplied from the opposite side from that of FIG. 4C.

Refer now to FIG. 4D, which is a graph of the nanoconverter output voltage versus time for various Peltier heater input voltages. These corresponding open-circuit voltages showed a direct relationship with the Peltier heater voltage (hence indirectly, temperature). The resistance of the nanoconverter remained relatively constant at ~90 kΩ over the narrow heating temperature range used for these tests.

As evident from the short circuit current and open circuit voltage traces, there is a slight lag in the recorded values in comparison to the applied voltage to the Peltier heater. This is likely due to the time it takes heat generated by the Peltier device to transfer through the sapphire/ZnO film and into the polymer as supported by FIG. 4B. The stability of the nanoconverter devices is also important, specifically how reproducible the peak and baseline current levels are during the "power-up" and "power-down" modes, respectively. The test devices were repeatedly cycled over many hours of operation and significant changes in the power output were not seen, although continual testing will be necessary to fully understand degradation pathways in the nanoconverters.

To confirm that the electrical signals are generated from the nanoconverter device and not an artifact of the experimental setup, lead exchange experiments were carried out on various devices. When the high source and low drain probes were reversed on the electrical contacts of the device, current levels of similar magnitude but opposite signs were recorded, indicating that the current flow was being driven by the nanoconverter and not by residual potentials generated by the measurement electronics. To verify that the electrical circuit setup was not interfering or causing any artificial voltages or current, the noise level of the probe station was tested by connecting different external loads (1-500 kΩ) in series without the nanoconverter device. Depending on the resistance load, the noise level in the electric current was found to range from ~50 nA (for 1 kΩ resistor) to ~0.1 nA (for 500 kΩ resistor) with an upper end in the voltage noise of ~50 μV. Therefore, using the measured resistance of ~90 kΩ for the nanoconverter device, a noise current contribution of <0.6 nA was predicted for the measured values.

Figure 4E:
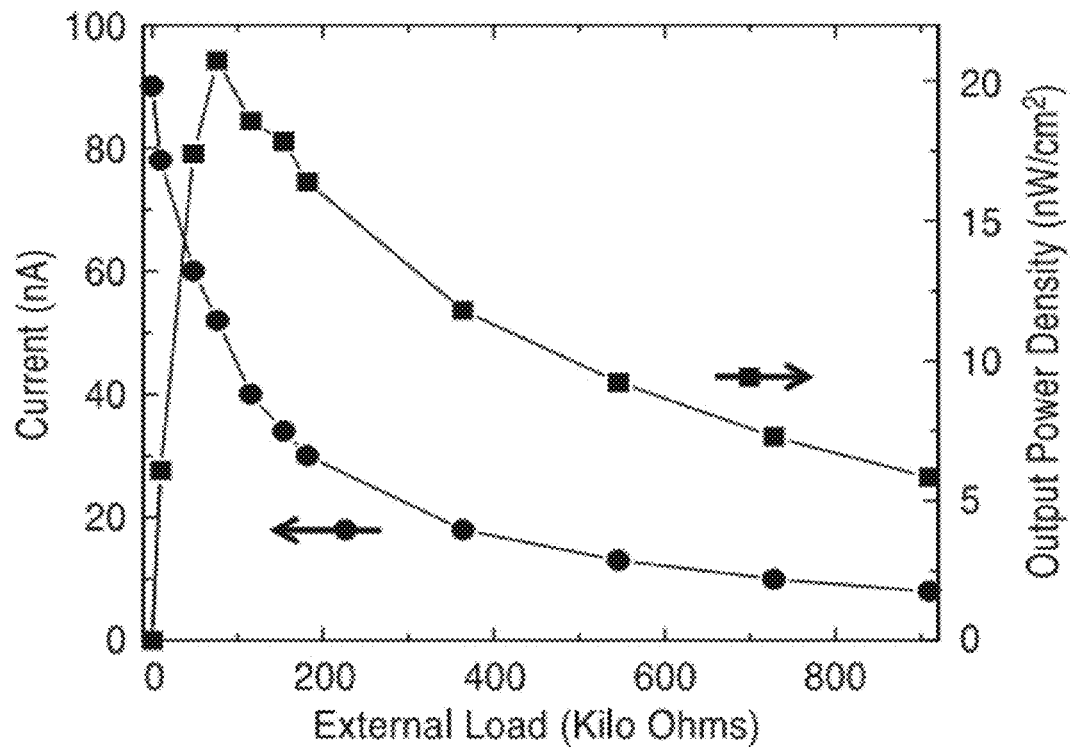
FIG. 4E is a graph of the nanoconverter output current and output power density for various load impedances.
Figure 4F:
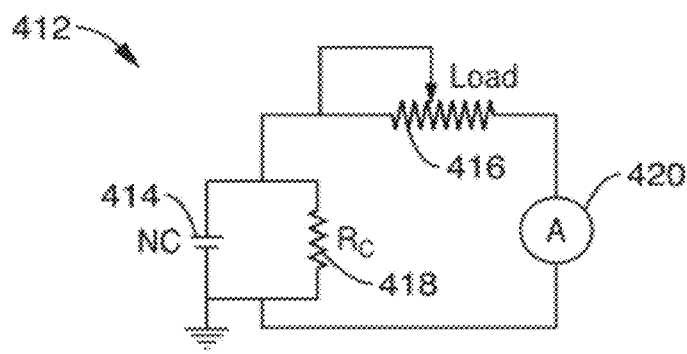
FIG. 4F is a schematic of the circuit used for the testing that produced the graph of FIG. 4E.

Refer now to FIG. 4E, which is a graph of the nanoconverter output current and output power density for various load impedances. Also refer now to FIG. 4F, which is the schematic 412 for the circuit used in this test. The maximum output power from the nanoconverter 414 device was measured by connecting different external series loads 416. The internal impedance of the nanoconverter 414 was modeled as a parallel resistance $R_c$ 418. In general, at a given heating temperature the maximum power output of the nanoconverter device was achieved when the external series load 416 approximately equaled the internal parallel resistance $R_c$ 418 of the nanoconverter 414. Current was measured by ammeter 420.

Figure 4G:
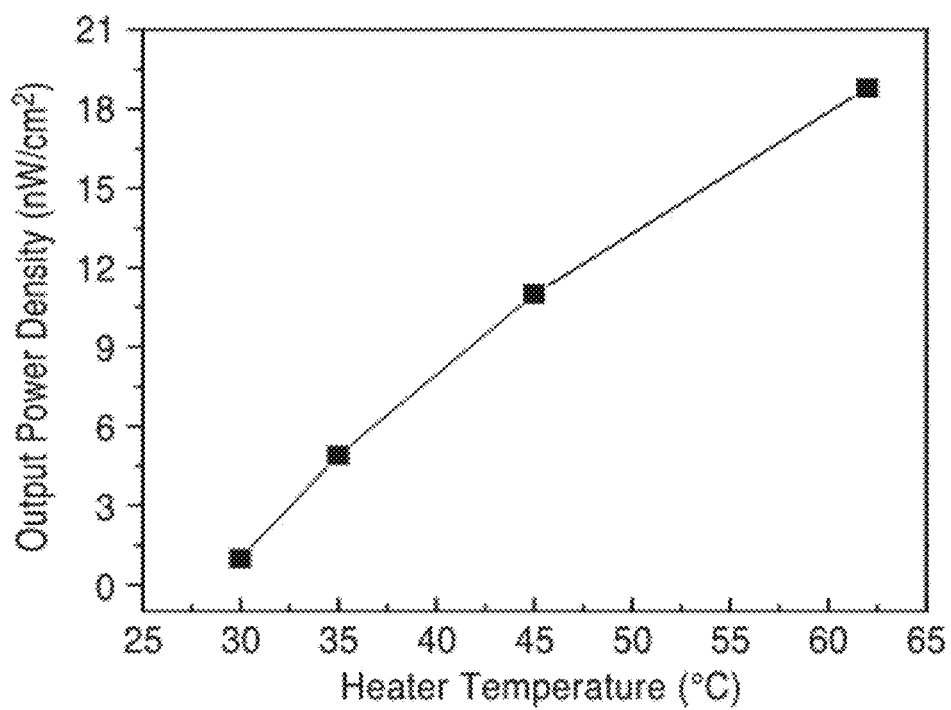
FIG. 4G is a graph of the nanoconverter output power density versus Peltier heater temperature.

Refer now to FIG. 4G, which is a graph of the nanoconverter output power density versus Peltier heater temperature. The effective contact area determined for a typical nanoconverter is ~1.0 mm×1.0 mm, which yields power density values of $10^{-19}$ nW/cm$^2$ for temperatures ranging from 22-60° C.

Even though the device configuration and performance are not optimized, the power densities are sufficiently high enough to meet the power requirements of many nanowire and nanotubes-based devices used for sensors and other nanoelectronic architectures. The physical working principle of the organic-inorganic hybrid device can be understood based on the piezoelectric behavior of ZnO nanowires. The nanowires have their c-axis oriented perpendicular to the substrate (parallel to growth axis) and produce a piezoelectric field potential when the Zn and O atoms are non-symmetrically moved due to strain on the crystal.

Figure 5A:
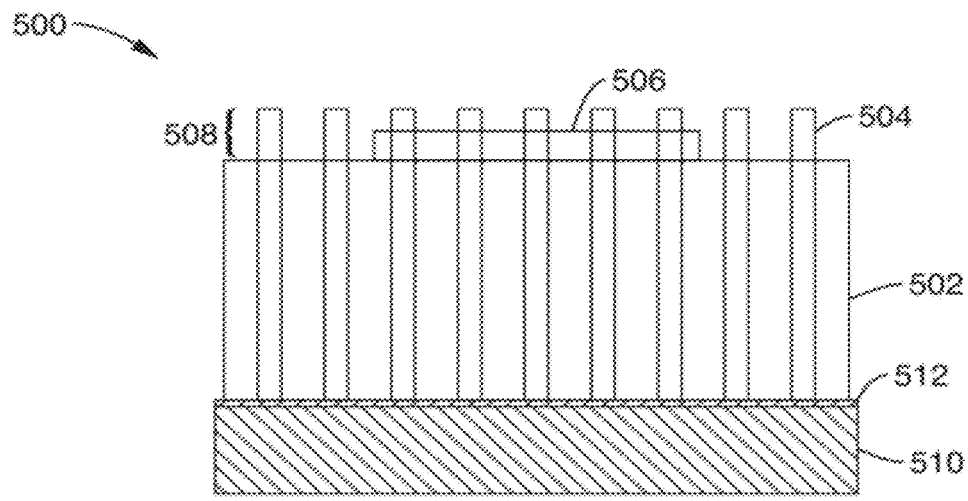
FIG. 5A is a cross section of a typical room temperature quiescent nanoconverter with uniform neutral charge distribution in the ZnO nanowires.
Figure 5B:
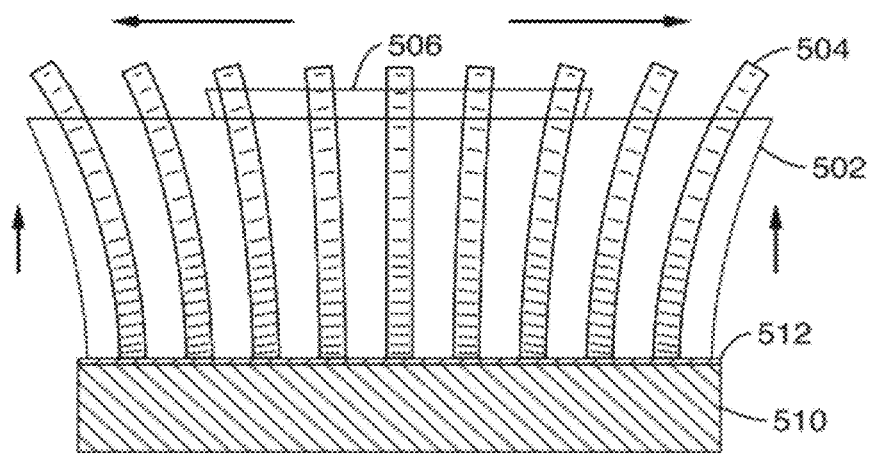
FIG. 5B is the cross section of FIG. 5A after heat has been applied to the substrate, thereby changing the potential gradients along the ZnO nanowires.
Figure 5C:
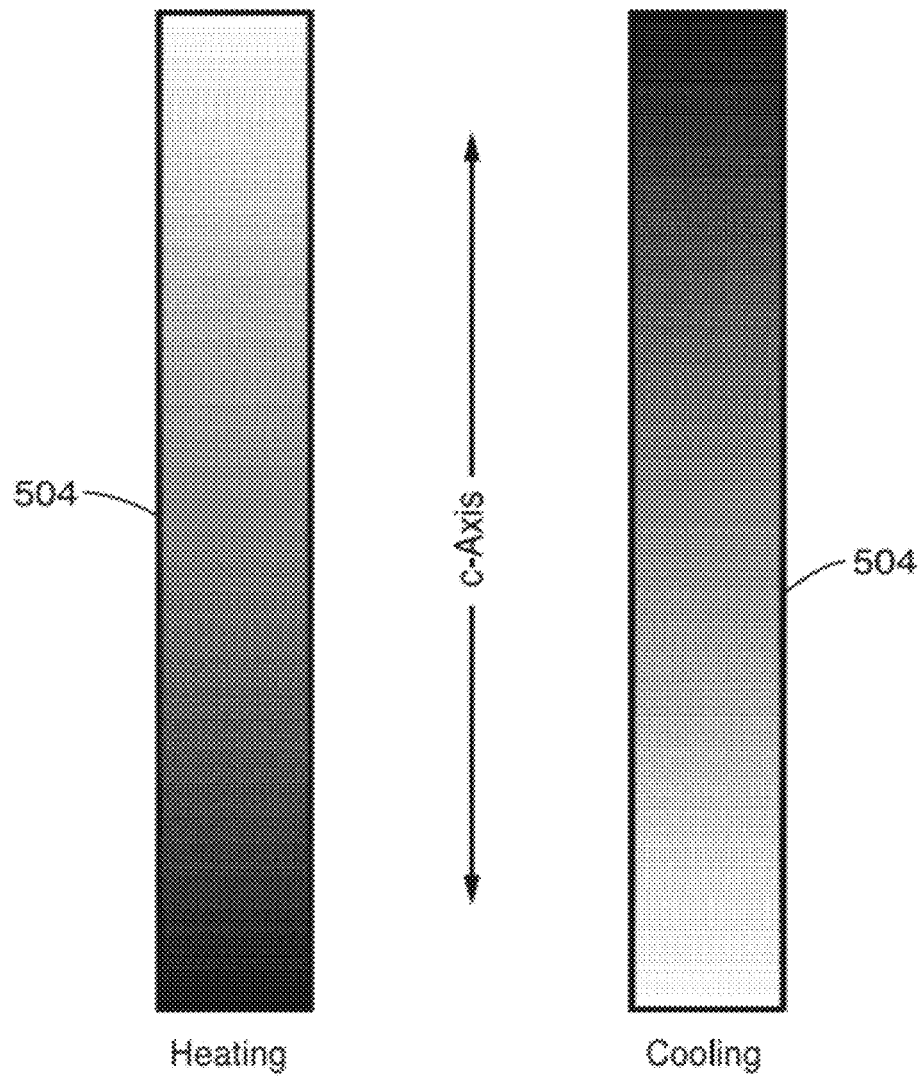
FIG. 5C shows a graduated charge distribution of a single ZnO nanowire under heating and cooling, reflecting opposite potential distributions depending on the direction of heat flow.

Refer now to FIGS. 5A-C, which illustrate that charge separation in the ZnO nanowires may be induced by the surrounding polymer matrix, which acts as a pulling handle on the nanowires as the polymer expands. In FIG. 5A, the typical room temperature situation, the quiescent nanoconverter 500 is seen. Here, a PVC polymer matrix 502 lies in a steady state (assuming constant ambient temperature) with ZnO nanowires 504 embedded in the PVC polymer matrix 502. The top electrode 506 connects the tips 508 of the ZnO nanowires 504. Both the PVC polymer matrix 502 and the bottom ends of the ZnO nanowires 504 adhere to the substrate 510.

Upon heating supplied from the substrate 510 (as shown in FIG. 5B), the PVC matrix 502 expands vertically and laterally as thermal energy is added to the substrate 510. The PVC polymer matrix 502 is not permitted to expand isotropically since it is attached to the underlying substrate 510, and therefore subjects the ZnO nanowires 504 to an axial tensile stress along the c-axis. It is also possible the ZnO nanowires 504 also undergo lateral stress that slightly bends the nanowires, but this motion is likely a weak contribution to the overall electrical signal (see discussion below). The thin underlying ZnO film 512 on top of the substrate 510 likely has little impact on the power generation ability of the nanoconverter devices. As in previous examples, here the substrate 510 was sapphire.

Refer now to FIG. 5C, which illustrates the potential gradient along the ZnO nanowires 504 relative to a ground state. In the configuration described here, the "Heating" gradient shows darker in regions of more negative potential relative to a ground state, gradually moving upward to a more positive region operating at a lower temperature, with the potential gradient extending along the ZnO nanowire 504 c-axis. The "Cooling" gradient shows the opposite signed charge distribution since the thermal gradient is reversed. The bottom of the nanowire is the interface between the nanowire and the sapphire substrate.

Figure 5D:
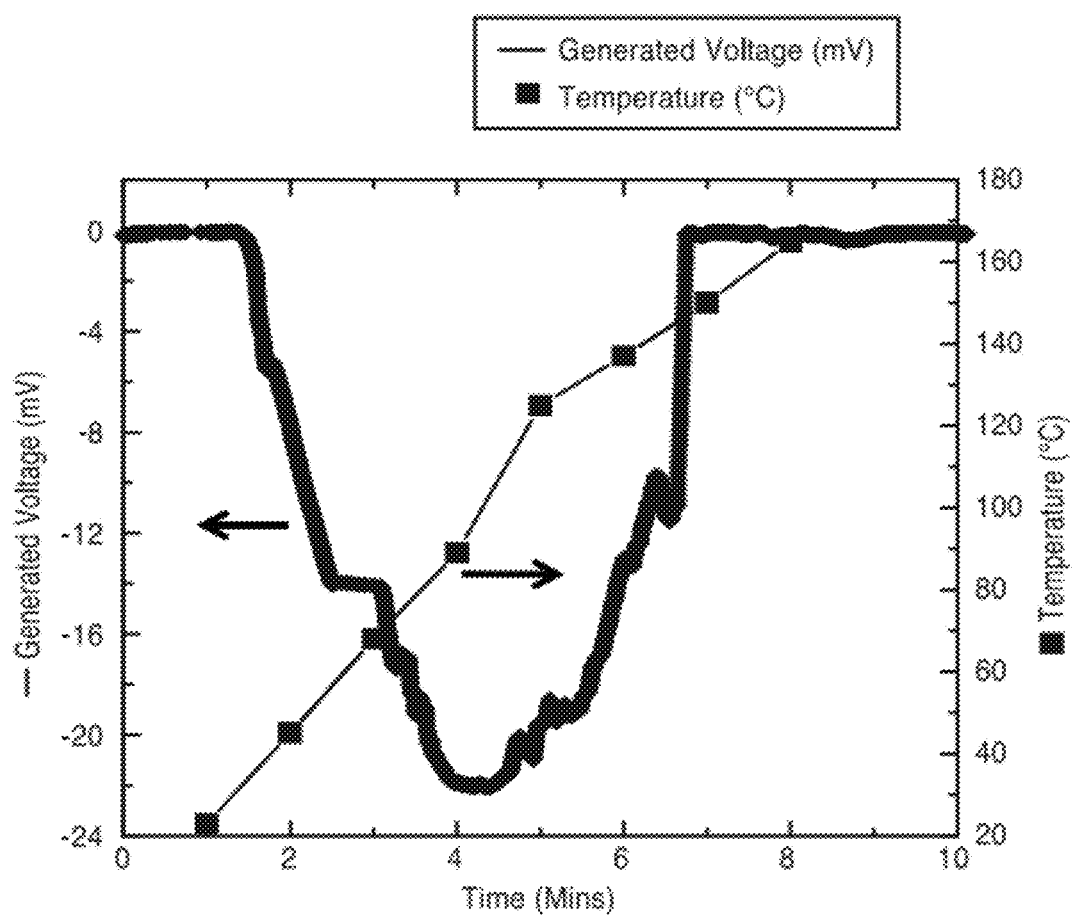
FIG. 5D is a graph oven temperature (square symbols) and generated output voltage as a function of time in minutes for the device of FIG. 5A.

Refer now to FIG. 5D, which is a graph oven temperature (square symbols) and generated output voltage as a function of time in minutes. Here, the voltage generated by a nanoconverter device heated in an oven from 20 to 165° C. is shown. At oven temperatures above ~100° C., the nanoconverter loses its ability to generate power because the PVC matrix polymer layer undergoes structural relaxation above its glass transition point ($T_g$ is ~65° C.).

FIG. 5D illustrates that the output voltage signal reaches its maximum (−22 mV) at ~100° C. before dropping sharply down to zero after 145° C. The rapid drop off in the voltage is presumably due to the onset of structural relaxation within the PVC matrix polymer layer as the glass transition temperature is reached. Interestingly, after cooling the nanoconverter device back to room temperature, it was found that the nanodevice no longer had the same capability to convert thermal energy into electric current. This is likely due to the ZnO nanowires detaching from the substrate during the heating process or degradation in the metal-semiconductor interfaces.

Figure 6:
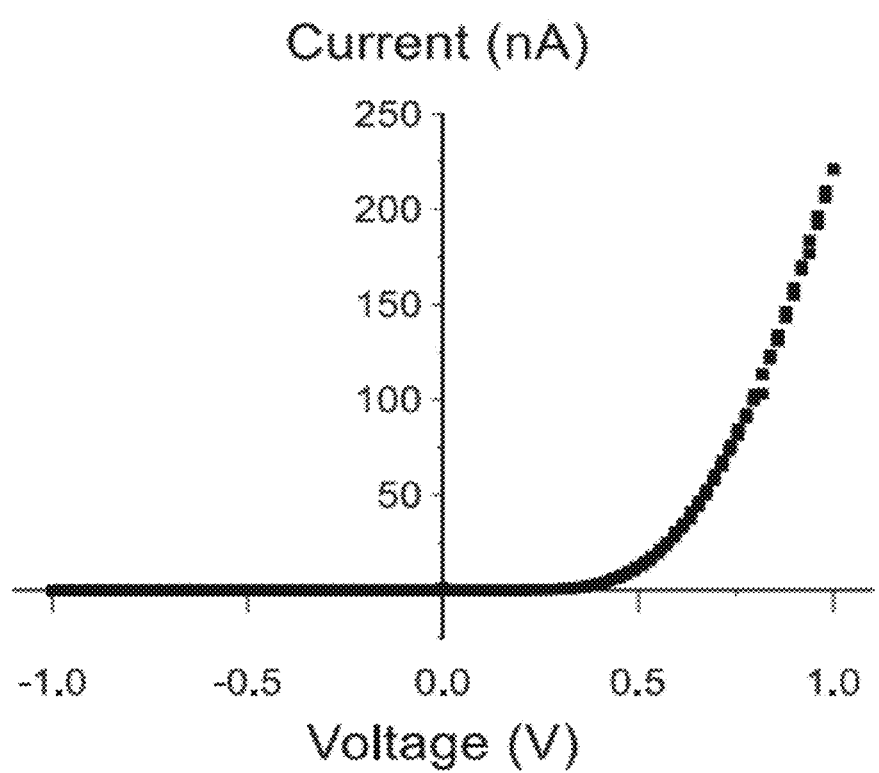
FIG. 6 is a graph of the electrical transport current-voltage (I-V) characteristics of a nanoconverter showing rectification behavior and a turn-on voltage at ~400 mV.

Refer now to FIG. 6, which is a characteristic current versus voltage (I-V) plot of a nanoconverter device showing rectification behavior and a turn-on voltage of ~400 mV.

The PVC film has a coefficient of thermal expansion (CTE) of $70 \times 10^{-6}/°$ K compared to sapphire and ZnO with CTEs of $8 \times 10^{-6}/°$ K and $3 \times 10^{-6}/°$ K, respectively. The substantial CTE mismatch between the substrate and the polymer film can lead to large residual stresses inside the PVC film upon a temperature change/fluctuation. Therefore, a piezoelectric nanowire array embedded in such a polymer matrix should be perturbed by the internal strain within the polymer as the temperature is elevated, thus providing a direct thermal-to-mechanical-to-electrical transformation in the ZnO nanoconverter.

Figure 7A:
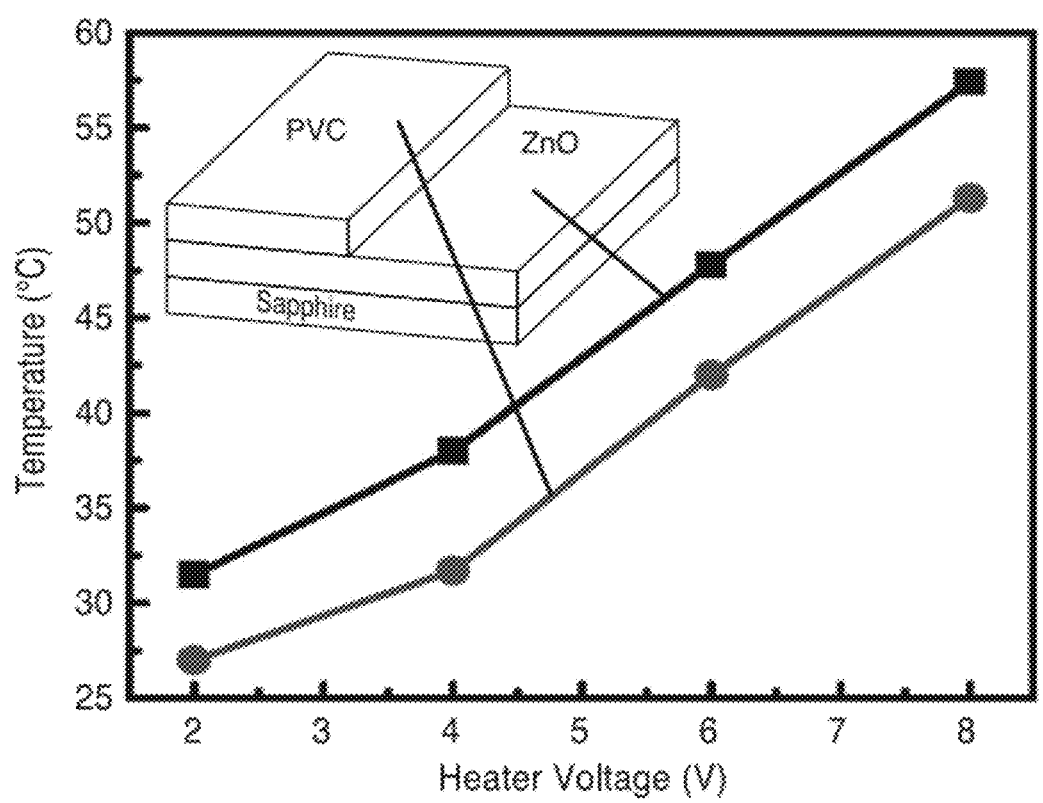
FIG. 7A is a graph of measured surface temperatures of the top of the PVC polymer matrix and the ZnO electrode atop the sapphire substrate versus heater voltage.

Refer now to FIG. 7A, which is a graph of measured surface temperatures of the top of the PVC polymer matrix and the ZnO electrode atop the sapphire substrate versus heater voltage.

Figure 7B:
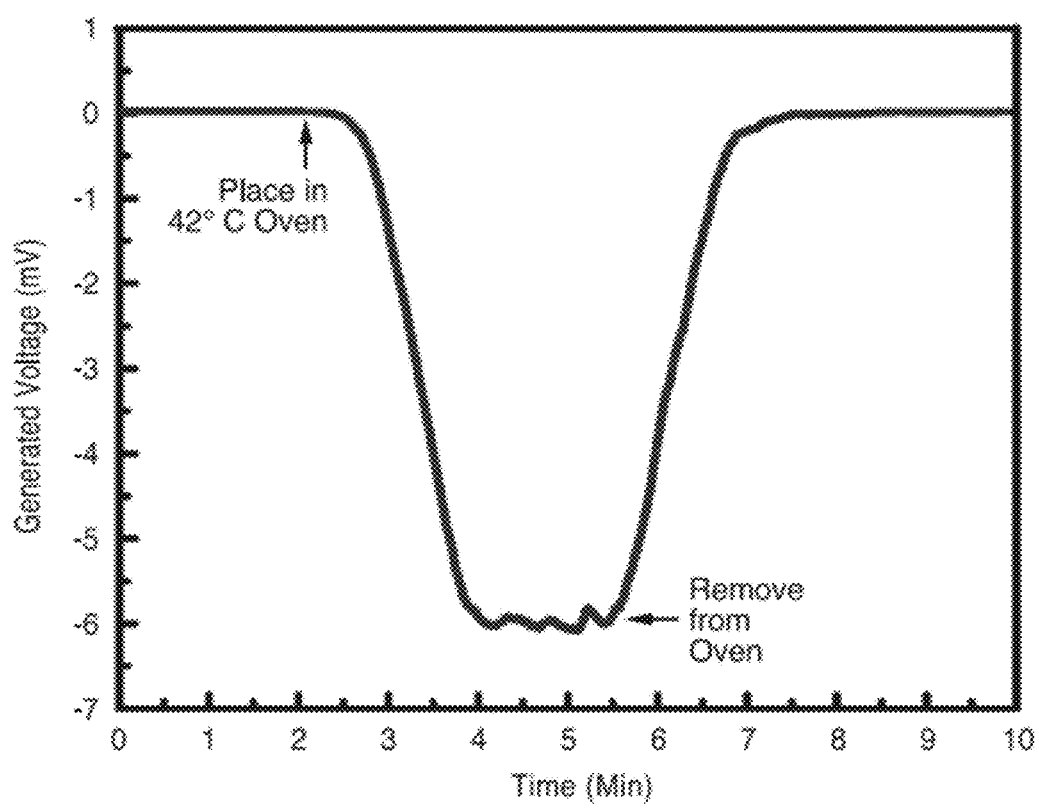
FIG. 7B is a plot of the nanoconverter of FIG. 7A output voltage versus time for a test first placing the nanoconverter into a 42° C. oven furnace, then removing the nanoconverter from the oven some time later.

Refer now to FIG. 7B, which is a plot of nanoconverter output voltage versus time for a test first placing the nanoconverter into a 42° C. oven furnace, then removing the nanoconverter from the oven. As can be seen, about −6 mV was output during the time period before 4 minutes to the time period after 5½ minutes while the nanoconverter is within the oven.

Figure 8:
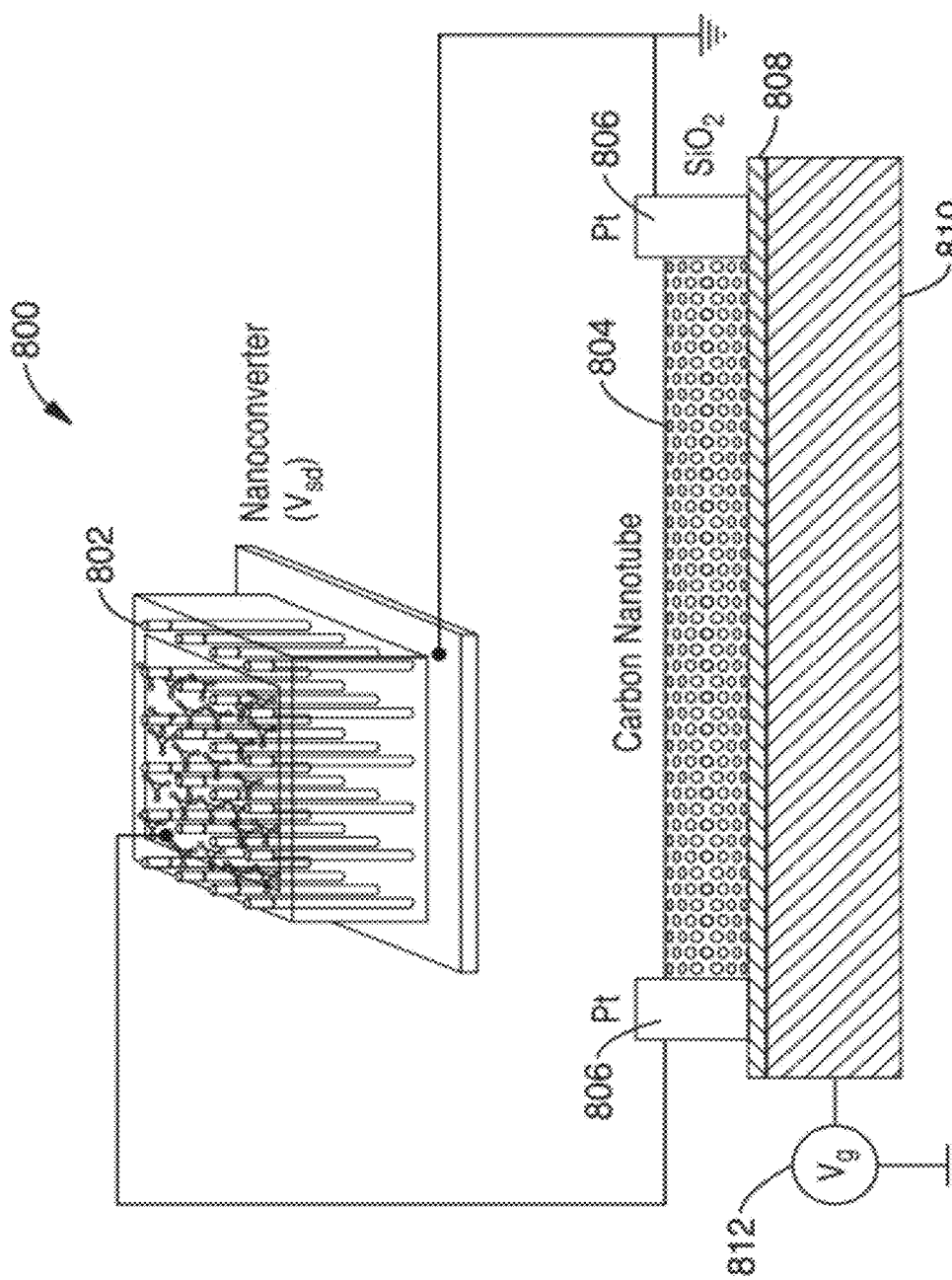
FIG. 8 is a schematic of a nanoconverter electrically connected to a carbon nanotube (CNT) at both ends by Pt contacts.

Refer now to FIG. 8, which is a schematic 800 of a nanoconverter 802 electrically connected to a carbon nanotube (CNT) 804 at both ends by Pt contacts 806. The CNT 804 and Pt contacts 806 are deposited upon a $SiO_2$ insulator 808 atop a Si substrate 810 that acts as gate to the CNT 804 field effect transistor (FET). The Si substrate 810 is in turn electrically connected to a voltage source 812 to control the CNT 804 FET.

Arrays of Individual Nanoconverters

Figure 9:
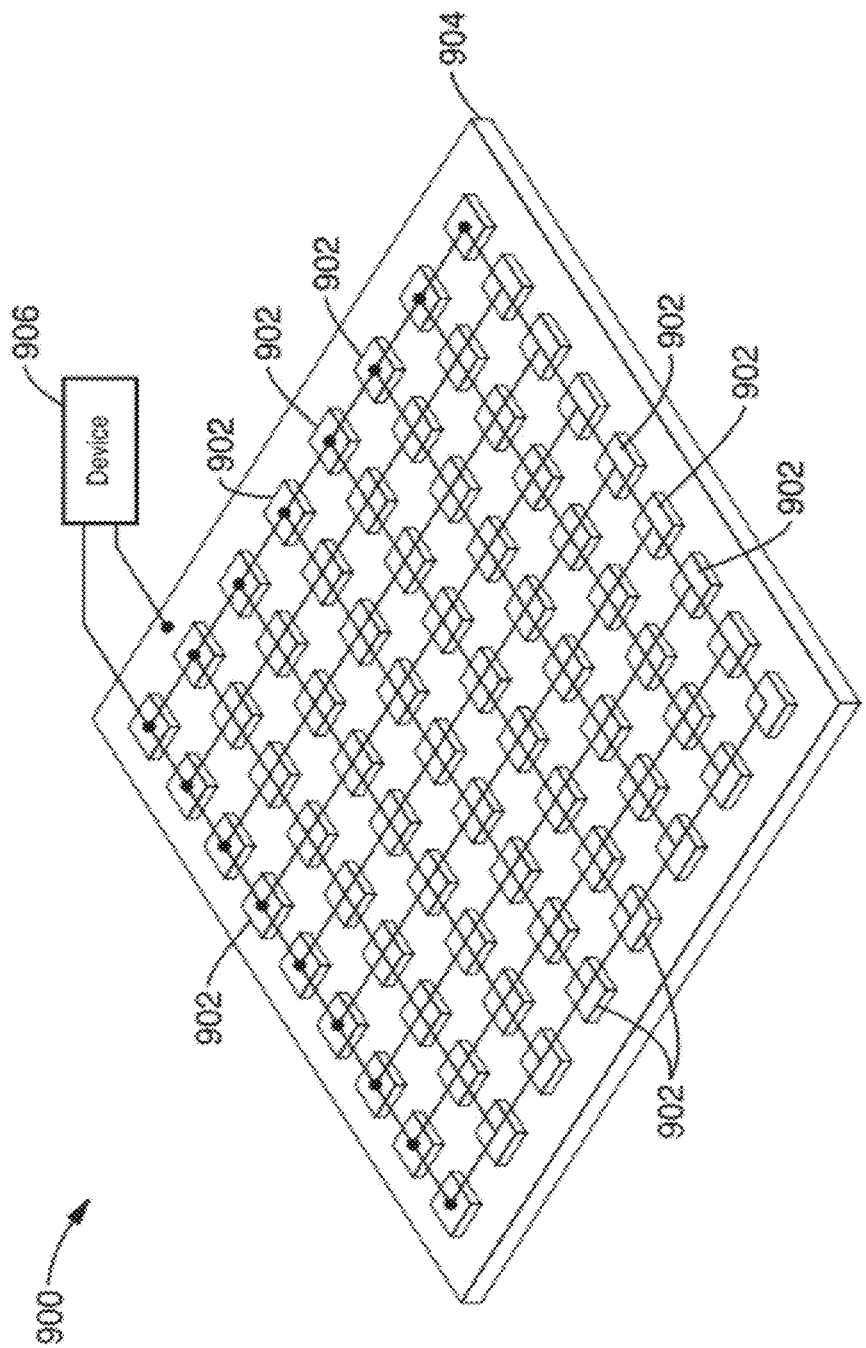
FIG. 9 is a perspective view of an array of individual nanoconverters shown arranged on an overall substrate.

Refer now to FIG. 9, which is a perspective view 900 of an array of individual nanoconverters 902 shown arranged on an overall substrate 904. The individual nanoconverters 902 may be electrically connected as required in series and parallel to provide increased voltage and current to power an external device 906. The array 900 shown in FIG. 9 comprises seventy two nanoconverters 902. The number of nanoconverters could be adjusted for the amount of power required to run a specific device 906.

Figure 10A:
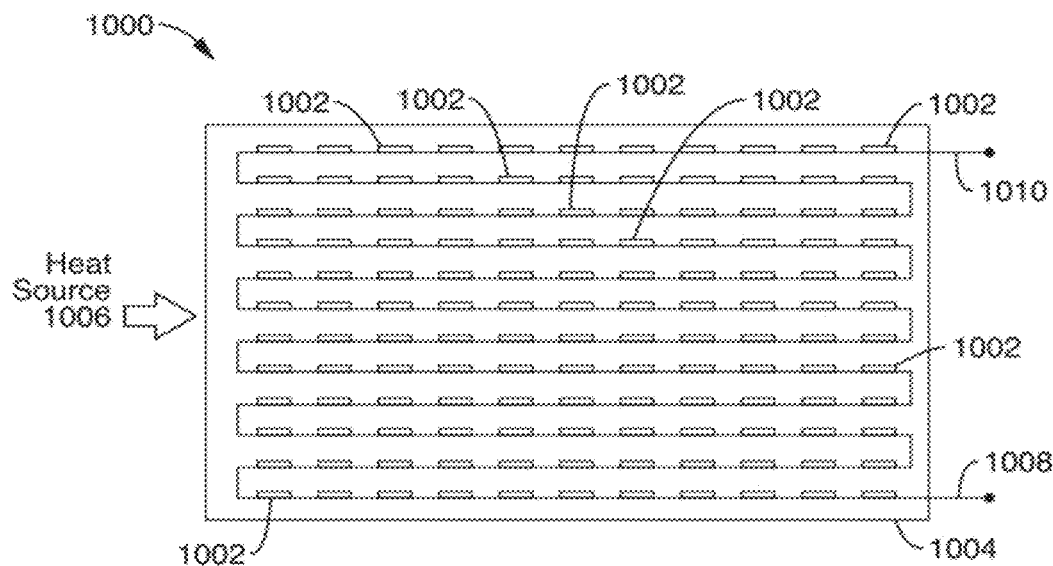
FIG. 10A is an array of individual nanoconverters arranged on an overall substrate that will directly generate electricity through piezoelectric nanowire deformation due to differential thermal expansion of a polymer matrix layer.

Refer now to FIG. 10A, which is an array 1000 of individual nanoconverters 1002 arranged on a substrate 1004 that will directly generate electricity through piezoelectric nanowire deformation due to differential thermal expansion of a polymer matrix layer (previously shown). The array 1000 and individual nanoconverters 1002 are exposed to a heat source 1006. The exposure of the nanowires or nanotubes (not shown in this drawing) in the nanoconverters 1002 to the heat source 1006 allows the nanoconverters 1002 to generate an electric current. The array 1000 of nanoconverters 1002 is connected by electrical leads 1008 and 1010 to an external device (not shown) that will be powered by the nanoconverters 1002.

Figure 10B:
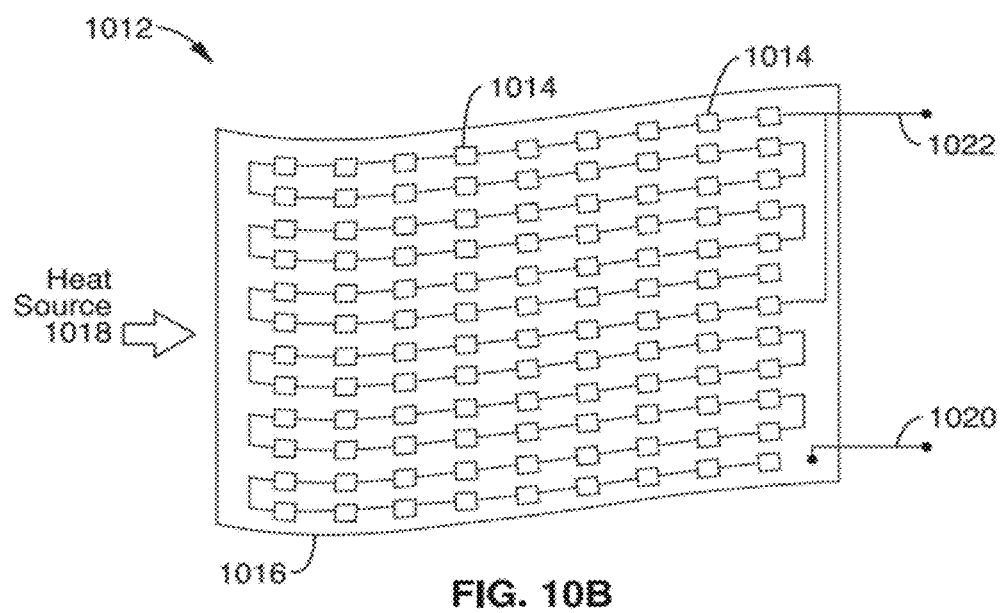
FIG. 10B is a perspective view of an array of nanoconverters somewhat similar to the one previously described in FIG. 10A, but with a flexible overall substrate, and arranged in a series parallel fashion to achieve increased voltage and current output.

Refer now to FIG. 10B, which is a perspective view of an array 1012 of nanoconverters 1014 somewhat similar to the one previously described in FIG. 10A, but with a flexible substrate 1016 and a heat source 1018, arranged in a series parallel fashion to achieve increased voltage and current outputs at power output leads 1020 and 1022.

With the advent of a flexible substrate, nanoconverter arrays may be stacked to form a three dimensional lattice for increased power supply. Alternatively, the substrates may be rolled into rolls, while still allowing input of a heat source, and minimizing volume.

Analysis and Further Discussion

Electrical current measurements (i.e., direction of current flow) shown in FIGS. 4B-D indicate that the tops of the ZnO wires (at the polymer-metal contact interface) become increasingly negative as the temperature rises and are positively charged at the other end (FIG. 5C). Note that the initial electronic state of the ZnO surfaces (e.g., the side surface), which could influence the polarity of the top and bottom portions of nanowires, may be generated by the oxygen plasma treatment used to expose the nanowire tips. From a first-order approximation, without considering the polarization and dielectric screening effect, the electric potential (U) created during tension can be calculated from $$U=[A_p E_p/(A_p E_p + A_{nw} E_{nw})] \times [(\alpha_p - \alpha_{nw}) \Delta T \times (L_{nw}/d_{33})],$$

where $E_p$ is the Young's modulus of PVC (2900-3300 MPa), $E_{nw}$ is Young's modulus of ZnO (~100 GPa), $\alpha_p$ is the thermal expansion coefficient of PVC (~70×10$^{-6}$/° K), $\alpha_{nw}$ is the expansion coefficient of ZnO (~3×10$^{-6}$/° K) along the c-axis, $L_{nw}$ is the nanowire length (~5 μm), $\Delta T$ is the change of the temperature, $d_{33}$ is the piezoelectric constant (~14.3-26.7 pm/V) of a ZnO nanowire along the c-axis, and $A_p$ and $A_{nw}$ are the cross sectional area fractions of the polymer and nanowire, respectively.

This idealized expression suggests that the maximum piezoelectric output voltage for a PVC matrix can be in the range of a few volts, but experimentally values around 10 mV were observed. Among the factors that influence the output potentials include the free carrier density of the ZnO nanowires (which creates a screening effect and reduces electric potentials) and the nature of the Schottky barrier (which affects the charge separation).

As expected, for a softer polydimethylsiloxane (PDMS) polymer matrix (see below) the strain is predicted to be about 3 orders of magnitude lower. The lateral expansion of the PVC polymer, which can induce bending in the nanowires, may also generate charge separation across the lateral direction leading to positive or negative potentials on the side surfaces of the nanowires. However, as the side surface of the nanowire tips is in constant contact with the Au top electrode, the fields generated by the displacement of $Zn_2^+$ and $O_2^-$ ions are immediately neutralized. As a result, the contribution of the bending motion to the overall piezoelectric effect of the nanoconverter described herein is expected to be small and may generally be ignored.

To better understand the nature of the polymer-induced tensile strain in the piezoelectric nanowires, the PVC polymer matrix was replaced with a softer PDMS polymer matrix. The smaller Young's modulus of PDMS (0.36-0.87 MPa), compared to PVC (2900-3300 MPa), should produce a weaker tensile strain, assuming similar adhesion interactions between the polymer and semiconductor, on the ZnO nanowires even though the CTE of PDMS (310×10$^{-6}$/° K) is higher than PVC (70×10$^{-6}$/° K). Both polymers have high electrical resistivities (~10$^{15}$ Ω·cm) and low thermal conductivities (<0.2 W/m·° K) leading to similar electrical insulation and temperature gradients across the polymer film. Under similar heating conditions (~50° C.) the PVC infiltrated nanoconverter produces about a 20-fold higher current level than the ZnO arrays filled with PDMS. In addition, if the polymer matrix is removed without disrupting the contacts, no signal is generated. Both of these controls help support a piezoelectric driven power and validate that the polymer matrix has a significant effect on the output properties of the nanoconverter devices.

As noted above, the energy barrier created at the metal-semiconductor interface is important in the nanoconverter mechanism for current generation. Given that the work functions of Au and Ag are 5.1 and 4.2 eV, respectively, the electron affinity ($E_a$) of ZnO is 4.5 eV, and without considering the near-surface state effects, the top Au—ZnO interface likely forms a Schottky-type barrier compared to the more ohmic bottom contact. The entire electric transport mechanism described in FIG. 3A therefore appears controlled by the top Au—ZnO interface.

When the negatively charged top surface (generated during tensile stress) is connected to the Au contact, the Au—ZnO interface is forward biased and electric current flows across the interface. Likewise, when the top surface is positively charged (generated under compression), the Au—ZnO interface is reverse biased and little electric current will flow across the junction. The strong self-generated electric current (FIG. 4C) and direction of electron flow supports this hypothesis. The model of the nanowire motion depicted in FIGS. 5A and 5B also suggests that the vertical alignment and Schottky contacts are key factors in generating DC power.

As the PVC polymer matrix begins to expand and exert stress on the nanowires, a piezoelectric potential is generated along the nanowire axis due the polarization of the $Zn_2^+$ and $O_2^-$ ions in the crystal. Because of the Schottky like interface and slow neutralization of the strain field in the nanowire, the piezoelectric potential can exist for long periods of time (tens to hundreds of seconds). It is likely that the piezoelectric potential observed here, given the slow deformation time of the polymer, is significantly reduced during the thermal experiments. Indeed, replacing the thermoplastic polymer matrix with faster responding matrices would be a direct route to enhancing the performance of the nanoconverter devices.

As the ZnO nanowires are strained by the expanding polymer, electrons begin to flow across metal-semiconductor junctions where the piezoelectric potential is high enough to overcome the interfacial energy barrier. This process can continue for long periods of time (minutes to hours) given the large number of metal-semiconductor energy barriers present across the nanowire array. The DC signal generated here is therefore apparently due to a collective contribution of independent nanowires discharging as the strain induced piezoelectric potential overcomes the local interfacial energy barriers between the nanowire and metal contact.

Since the PVC polymer matrix used has a nominal glass transition temperature ($T_g$) of ~65° C., it was expected that a device infiltrated with PVC will lose its ability to harvest thermal energy at temperatures above $T_g$ due to the structural relaxation and/or conformational changes in the polymer.

To test the operational temperature range of the nanoconverter, a nanoconverter device was continuously heated from room temperature to 165° C. in a furnace while monitoring its output voltage performance.

The PVC polymer used in these experiments is a sufficient thermal insulator (thermal conductivity ~0.19 W/m K), and it is anticipated that thermal gradients will form across the polymer film as well as locally around the ZnO nanowires. To get a better understanding of the thermal gradient across the polymer film, the temperature at the top of the polymer surface and the top of the ZnO thin film was measured (FIG. 7A) using small (<0.5 mm) k-type thermocouples.

Since the as-grown ZnO nanowires are n-type semiconductors, the temperature gradient along the c-axis invokes a negative and positive electric potential on the top and bottom surfaces, respectively, suggesting that the potentials observed in FIG. 4D could be the contribution of both piezoelectric and thermoelectric effects. To differentiate the thermoelectric from the piezoelectric potential, a nanoconverter device was homogeneously heated (i.e., the top and bottom sides of the device have the same temperature) to about 42° C. in a furnace, thus minimizing any temperature gradients across the polymer film. As illustrated in FIG. 7B, the isothermally heated NC device produced an output potential that was about 0.4 mV less than the potential produced with a similar device heated from the backside only (FIG. 4D). At 42° C., under Peltier heating, the temperature gradient between the top and bottom surface of the polymer (FIG. 7A) is ~6 K.

The average Seebeck coefficient (S)–dV/dT, where dV is the thermoelectric potential, and dT is the temperature gradient) of the ZnO nanowires is thus estimated to be −67 μV/K, assuming the temperature gradient of the ZnO nanowires is the same as that of the polymer. However, since the thermal conductivity of the ZnO nanowires ($3^{-10}$ W/m K) is substantially higher than that of PVC, the estimated Seebeck coefficient value is likely an upper limit. This value is reasonably smaller than high performance thermoelectric materials such as $Bi_2Te_3$ (−287 μV/K, n-type). Comparing the output performance of the isothermally and bottom-heated devices suggests that over 94% of the electric potential generated comes from the piezoelectric contributions, which is consistent with recent calculations using perturbation theory.

Further supporting data comes from control runs using non-piezoelectric silicon nanowire arrays. Silicon nanowire arrays were synthesized via an electroless etching approach that resulted in nanowires with dimensions similar to the ZnO nanowire arrays (~100 nm diameters; 10 μm lengths). As evident from short-circuit traces, only very small currents are generated from a Si nanowire array infiltrated with PVC as a polymer layer. The measurable current output likely stems from a thermoelectric effect that has recently been reported for silicon nanowires. The dominance of the piezoelectric contribution is also supported by the elevated (above $T_g$) heating and the polymer exchange experiments.

In summary, an energy conversion platform has been demonstrated that utilizes nanostructured piezoelectrics embedded in an environmental-responsive polymer matrix to convert thermal energy into electrical power. The device architecture does not require elaborate top contacts or electrodes to produce DC power as the output relies on the collective discharging of individual transducers with different metal-semiconductor energy barriers. Since the transduction mechanism is driven by the material coupled to the piezoelectrics, the infiltrating matrix polymer layer and device design may be tailored so that power can be scavenged from various energy sources including light, mechanical, pressure, fluids, and/or chemical. These promising results demonstrate the effectiveness of a matrix-assisted piezoelectric nanoenergy converter and highlight the unique attributes of environmental-responsive coatings in creating multifunctional nanopower devices and sensors.

Nanoconverter Fabrication Methods
Nanowire Growth

The ZnO nanowire (NW) arrays were synthesized via a carbothermal reduction process at 915° C. A 2 mm by 2 mm a-plane oriented (110) sapphire substrate (MTI Corporation) was used for epitaxial growth. After cleaning, the substrate was coated with a 2.5 nm Au layer deposited by e-beam evaporation, which acted as the catalyst for the ZnO nanowire growth. Equal amounts (by weight) of ZnO powder (99.99%, Alfa Aesar) and graphite powder (99.99%, Alfa Aesar) were ground together for 30 min. and loaded into an alumina boat. The substrate and the alumina boat were placed near the centre of a double quartz tube furnace, with the sapphire substrate located downstream 5-6 cm away from the ZnO/graphite powder. The flow rate of Ar was kept at a constant value of 12 standard cubic centimeters per minute (sccm). During nanowire growth, the mini-tube-furnace (Lindberg/Blue, Thermo Fisher Scientific) was heated to 915° C. at a ramping rate of ~50° C./min. After holding the temperature at 915° C. for 10 min., the furnace was cooled down to room temperature.

Nanodevice Fabrication and Electrical Measurements

Before infiltrating the ZnO nanowires with polymer, the nanowire samples were examined using a field-emission SEM (JEOL JSM-7401F). The reported nanowire density was measured from a number of top-view SEM images by counting nanowire numbers per $μm^2$ area. A thermal plastic poly(vinyl chloride-covinyl-co-2-hydroxypropyl acrylate) (PVC) with a molecular amount of ~24,000 was dissolved in 1,4-dioxane to a concentration of 1 wt. %. The PVC solution was drop cast (25 to 40 μL of solution) onto the ZnO nanowire arrays to completely coat the nanowire tips and form a uniform film at the top surface of the nanodevice.

After infiltrated with the polymer, an oxygen plasma etching process was employed to preferentially etch away the PVC and expose the nanowire tips. This process was carried out on a reactive ion etching system with an operation power of 300 W and an oxygen flow rate of 90 sccm. After 3-5 minutes of etching time, the samples were examined by SEM to ensure that the nanowire tips were exposed. For the above described etching condition, a typical nanowire exposure percentage of ~50-60% (i.e., ~15 nanowires/$μm^2$) was observed. A 4 nm Ti/150 nm Au contact layer was deposited on the top surface by e-beam evaporation. The deposition rate was ~1 Å/s. An aluminum foil mask with a 1 mm×1 mm hole was used to ensure that the metal layer was deposited on the centre area of the substrate where nanowires tend to grow more uniformly. After top-contact fabrication, one edge of the device was carefully scratched under an optical microscope until the ZnO film was exposed and silver paste was deposited as the bottom electrode. The PVC film is nonconductive and therefore acts as an insulator between the top and bottom electrodes. SEM and AFM (MFP-3D, Asylum Research) were performed to examine the surface morphology of the as-fabricated devices.

The fabrication details of the carbon nanotube field-effect transistors used here are available in the literature. The carbon nanotube used was single-walled at 1.2 nm diameter and 5 μm long.

For electrical property measurements, a Signatone S-1160 probe station with a Keithley 2602 source meter was used. All the data presented here were obtained in an ambient environment. The experiments for driving single carbon-nanotube field-effect transistor were carried out using one-single drop of ethanol with data acquisition rate of 20 points/second. It took 6 seconds to finish one cycle of scan. Experimental environment and ethanol properties. All the solvent dripping experiments were carried out in an ambient atmosphere within a fume hood, where the temperature was measured to be 21° C. The ethanol liquid used in the experiment was purchased from SIGMA-ALDRICH (St. Louis, Mo., USA), which has a purity ≧99.5% (200 proof) and a density of 0.789 g/mL (at 20-25° C.). The vapor pressure of the ethanol at 20° C. is 44.6 mmHg. Therefore, it evaporates in ambient environment with the evaporation residue ≦0.001%. During a single drop ethanol dripping experiments, the temperatures of top and substrate sides of the devices were monitored with two separate K-type thermocouples, which indicated that the substrate temperature of the devices maintains relatively stable at 21° C., while the temperature at the top surface fluctuates slightly in the range of 21° C. to 17° C.

The following analysis comes from a paper entitled "Supporting Information—Matrix-Assisted Energy Conversion in Nanostructured Piezoelectric Arrays" by Xianying Wang, Kanguk Kim, Yinmin Wang, Michael Stadermann, Aleksandr Noy, Alex V. Hamza, Junhe Yang, and Donald J. Sirbuly, which may be found at http://pubs.acs.org/doi/suppl/10.1021/nl102863c/suppl_file/nl102863c_si_001.pdf and is hereby incorporated by reference in its entirety.

Nanoconverter Theoretical Analysis

A) Piezoelectric Potential Due to Matrix Assisted Strain: A First-Order Approximation The nanowire and polymer matrix have the same strain because it is aligned to the force axis and both ends are fixed; thus, $$\epsilon_n^T = \epsilon_p^T \tag{1}$$

where $\epsilon_n^T$ is the total strain of nanowire and $\epsilon_p^T$ is the total strain of polymer. Each strain term has two components, thermal stain and mechanical strain, and the difference in mechanical strain between the polymer and nanowire can be expressed as a function of temperature. The initial state is when the polymer and nanowire are at equilibrium at room temperature. Equation (1) can be rearranged as $$\epsilon_n^T = \epsilon_n^{Therm} + \epsilon_n^m = \alpha_n \Delta T + \epsilon_p^m = \alpha_p \Delta T + \epsilon_p^m = \epsilon_p^{Therm} + \epsilon_p^m = \epsilon_p^T$$

$$\epsilon_n^m - \epsilon_p^m = (\alpha_p - \alpha_n) \Delta T \tag{1-1}$$

where $\epsilon^{Therm}$ is the thermal stain, $\epsilon^m$ is the mechanical strain, $\alpha_n$ is the thermal expansion coefficient of the nanowire, $\alpha_p$ is the thermal expansion coefficient of the polymer, and $\Delta T$ is the temperature difference between the initial and final state.

At equilibrium there is no external force and the sum of the polymer matrix and nanowire stress is given by:

$$\sigma^T = A_n \sigma_n + A_p \sigma_p = 0 \tag{2}$$

where $\sigma^T$ is the average stress of the matrix, $A_n$ is the cross-section area fraction of the nanowire, $A_p$ is the cross-section area fraction of the polymer, $\sigma_n$ is the stress of the nanowire, and $\sigma_p$ is the stress of the polymer.

Since $\sigma_n = E_n \cdot \epsilon_n^m$ and $\sigma_p = E_p \cdot \epsilon_p^m$, we have $\epsilon_n^m - \epsilon_p^m = (\alpha_p - \alpha_n) \Delta T$, so that $$A_n E_n \varepsilon_n^m + A_p E_p \varepsilon_p^m = 0 \Rightarrow \varepsilon_p^m = -\frac{A_n E_n}{A_p E_p} \varepsilon_n^m \tag{3}$$

$$\varepsilon_n^m = \frac{A_p E_p}{A_p E_p + A_n E_n} (\alpha_p - \alpha_n) \Delta T$$

The piezoelectric potential is defined by $$U = \frac{\delta l}{d_{33}},$$

where $d_{33}$ is the piezoelectric constant, so that:

$$U = \frac{\delta l}{d_{33}} = \frac{\varepsilon_n^m l}{d_{33}} = \frac{A_p E_p}{A_p E_p + A_n E_n} (\alpha_p - \alpha_n) \Delta T \frac{1}{d_{33}} \tag{4}$$

B) Deformation Strain Rates of ZnO Nanowires at Different Heater Voltages

To calculate the deformation strain rates of ZnO nanowires, the following equation is used:

$$\frac{d\varepsilon}{dt} = (\alpha_{PVC} - \alpha_{ZnO}) \times \frac{dT}{dt} \tag{5}$$

where $\epsilon$ is the strain in the nanowires, t is the time, T is the temperature, $\alpha_{PVC}$ and $\alpha_{ZnO}$ are the coefficients of thermal expansion of respectively PVC and the ZnO nanowires, respectively. Table 1 lists the calculated heating rates and deformation strain rates of the nanowires in the nanodevice during the matrix assisted deformation process.

Nanoconverters Embodiments

From the discussion above it will be appreciated that the invention can be embodied in various ways, including the following.

1. A nanoconverter, comprising: one or more nanostructures comprising a top end and a bottom end; wherein the nanostructures are at least partially embedded within a polymer layer; and means for generating power from the nanostructures.

2. The nanoconverter of embodiment 1, wherein the means for generating power comprises: a bottom electrode disposed on bottom end of one or more of the nanostructures; and a polymer layer into which the nanostructures are embedded.

3. The nanoconverter of embodiment 1, wherein the means for generating power comprises a top electrode electrically connected to one or more of the nanostructures at the nanostructure top end.

4. The nanoconverter of embodiment 1, where the nanostructures are selected from the group of nanocomponents consisting of: a nanotube, a nanowire, a nanosheet, and a nanoribbon.

5. The nanoconverter of embodiment 1, wherein the nanostructures are selected from the group of nanostructures consisting of: a ZnO nanowire, a silicon nanowire, a carbon nanotube, and a semiconductor nanostructure.

6. The nanoconverter of embodiment 1, wherein the nanostructures are either aligned or substantially vertically aligned.

7. The nanoconverter of embodiment 6, wherein the means for generating power comprises a heat source applied to the polymer layer.

8. The nanoconverter of embodiment 1, wherein the heat source is selected from the group of heat sources consisting of: an exhalation, a combustion source, an electronic source, a solar source, and a biological oxidation source.

9. The nanoconverter of embodiment 8, wherein the exhalation originates from the group of exhalants consisting of: human breath, non-human animal breath, bacterial outgas, and plant outgas; and wherein the biological oxidation originates from the group of biological oxidizers consisting of: human metabolism, non-human metabolism, bacterial metabolism, and plant metabolism.

10. The nanoconverter of embodiment 1, wherein the polymer layer comprises a coefficient of thermal expansion selected from the group of thermal expansions consisting of: $\geq 40 \times 10^{-6}/°$ K, $\geq 50 \times 10^{-6}/°$ K, $\geq 60 \times 10^{-6}/°$ K, $\geq 70 \times 10^{-6}/°$ K, and $\geq 80 \times 10^{-6}/°$ K.

11. The nanoconverter of embodiment 1, wherein a ratio of a coefficient of thermal expansion of the polymer layer divided by a coefficient of thermal expansion of the nanostructure comprises a ratio selected from the group of ratios consisting of: $\geq 2.000$, $\geq 3.000$, $\geq 4.000$, $\geq 5.000$, $\geq 6.000$, $\geq 7.000$, $\geq 8.000$, $\geq 9.000$, and 10.000.

12. The nanoconverter of embodiment 11, wherein the coefficient of thermal expansion nanostructure is taken from a c-axis.

13. An array of one or more nanoconverters of embodiment 1 that forms a nanoconverter array, arranged to generate a specified current and voltage output when supplied with a heat source.

14. The nanoconverter array of embodiment 13, wherein the heat source is at a temperature between an initial fabrication temperature of the polymer layer and a glass transition temperature $T_g$ of the polymer layer.

15. The nanoconverter array of embodiment 13, wherein the nanoconverter operates as a nanosensor to detect a temperature by generation of a voltage when the temperature is applied to the polymer layer.

16. The nanoconverter of embodiment 1, further comprising an environmental sealant that seals the top end of the nanostructure from environmental degradation.

17. The nanoconverter array of embodiment 13, wherein the means for generating power generates output power for one or more of the group of devices consisting of: a cell phone, a smart phone, a glucose monitor, a pacemaker, a therapeutic or diagnostic device, a drug delivery device, an insulin pump, a left ventricular assist device, a pacemaker, a cardioverter defibrillator, or an artificial muscle device, a cochlear implant, a batteryless device, a powered nanomachine, a smart phone, a calculator, a wrist watch, a standalone sensor, a sensor in a network, and an artificial vision device.

18. The nanoconverter array of embodiment 13, wherein the means for generating power generates output power for an insulin control system, said insulin control system comprising: a nanosensor glucose monitor that produces a voltage proportional to a glucose molecule concentration; a controller that senses the nanosensor glucose monitor voltage; and an insulin pump controlled by the controller whereby insulin is disseminated when the nanosensor glucose monitor voltage is exceeded.

19. The nanoconverter of embodiment 1, wherein the polymer layer is selected from the group of polymers consisting of: epoxy, polydimethylsiloxane (PDMS), and poly(vinyl chloride-co-vinyl-co-2-hydroxypropyl acrylate) (PVC).

20. The nanoconverter of embodiment 1, further comprising: a top electrode that electrically connects to the nanostructure at the nanostructure top end; and a bottom electrode that electrically connects to the nanostructure at the nanostructure bottom end.

21. A nanoconverter apparatus, comprising: a nanostructure with top and bottom ends; a top electrode electrically connected to the top end; a polymer layer that surrounds at least a portion of the nanostructure; wherein the surrounded portion of the nanostructure forms a stress transfer zone; and a bottom electrode electrically connected to the nanostructure at the bottom end of the nanostructure; wherein the nanostructure generates a piezoelectric voltage and a current when the polymer layer exerts a stress on the nanostructure in the stress transfer zone.

22. The nanoconverter apparatus of embodiment 21, wherein the nanostructure is selected from the group of nanocomponents comprising: a nanotube, a nanowire, a nanosheet, and a nanoribbon.

23. The nanoconverter apparatus of embodiment 21, wherein the nanostructure is selected from the group of nanostructures consisting of: a ZnO nanowire, a silicon nanowire, a carbon nanotube, and a semiconductor nanostructure.

24. The nanoconverter apparatus of embodiment 21, wherein the nanostructure is an element of an aligned or substantially vertically aligned forest of nanostructures.

25. The nanoconverter apparatus of embodiment 21, wherein the nanostructure generates the piezoelectric voltage and the current through stress induced on the nanostructure by the polymer layer in the stress transfer zone.

26. The nanoconverter apparatus of embodiment 25, wherein the polymer layer exerts the stress induced on the nanostructure from a heat source comprising an exhalation.

27. The nanoconverter apparatus of embodiment 26, wherein the exhalation originates from the group of exhalants consisting of: human breath, non-human animal breath, bacterial outgases, and plant outgases.

28. A nanoconverter array, comprising: an array of one or more nanoconverters of embodiment 21; wherein the nanoconverters are arranged to generate a specified current output and voltage output when a heat source is supplied to the polymer layers of the nanoconverters.

29. The nanoconverter array of embodiment 28, wherein the nanoconverter operates as a nanosensor to detect a temperature by generation of the piezoelectric voltage output.

30. The nanoconverter array of embodiment 28, wherein the nanostructure generated piezoelectric voltage and current outputs power to one or more of the group of devices consisting of: a cell phone, a smart phone, a glucose monitor, a pacemaker, a therapeutic or diagnostic device, a drug delivery device, an insulin pump, a left ventricular assist device, a pacemaker, a cardioverter defibrillator, or an artificial muscle device, a cochlear implant, a batteryless device, a powered nanomachine, and an artificial vision device.

31. The nanoconverter array of embodiment 28, wherein the nanostructure generated piezoelectric voltage and current powers: an insulin control system, said insulin control system comprising: a nanosensor glucose monitor that produces a voltage proportional to a glucose molecule concentration; a controller that senses the nanosensor glucose monitor voltage; and an insulin pump controlled by the controller whereby insulin is disseminated when the nanosensor glucose monitor voltage is exceeded.

32. The nanoconverter apparatus of embodiment 21, wherein the polymer layer is selected from the group of polymers consisting of: epoxy, polydimethylsiloxane (PDMS), and poly(vinyl chloride-co-vinyl-co-2-hydroxypropyl acrylate) (PVC).

33. A method of constructing a nanoconverter, comprising: providing a substrate; growing one or more nanostructures on the substrate, while growing a bottom electrode one the substrate, wherein the bottom electrode is electrically connected with one or more of the nanostructures; surrounding one or more of the nanostructures with a polymer layer to form a stress transfer zone around the nanostructures; selectively etching the polymer layer around the nanostructures to form a top end of the nanostructure exposed above the etched polymer layer; and electrically connecting the nanostructures at the top end and the bottom electrode, wherein the two ends have disposed between them the stress transfer zone.

34. The method of constructing the nanoconverter of embodiment 33, further comprising exposing the polymer layer to a heat source, thereby generating electrical power through thermal expansion of the polymer layer transferring stresses to the nanostructures in the stress transfer zone.

35. The method of constructing the nanoconverter of embodiment 34, wherein the nanostructures are selected from the group of nanocomponents comprising: a nanotube, a nanowire, a nanosheet, and a nanoribbon.

36. The method of constructing the nanoconverter of embodiment 34, wherein the nanostructures are selected from the group of nanostructures consisting of: a ZnO nanowire, a silicon nanowire, a carbon nanotube, and a semiconductor nanostructure.

37. The method of constructing the nanoconverter of embodiment 33, wherein the nanostructures are aligned or substantially vertically aligned.

38. The method of constructing the nanoconverter of embodiment 34, wherein the nanostructures generate the electrical power through a piezoelectric effect of stressing the nanostructures in the stress transfer zone.

39. The method of constructing the nanoconverter of embodiment 38, wherein the heat source originates from a source consisting of an exhalation.

40. The method of constructing the nanoconverter of claim 39, wherein the exhalation originates from the group of exhalants consisting of: human breath, non-human animal breath, bacterial outgases, and plant outgases.

41. The method of constructing the nanoconverter of embodiment 33, wherein the polymer layer is selected from the group of sealants consisting of: epoxy and poly(vinyl chloride-co-vinyl-co-2-hydroxypropyl acrylate) (PVC).

42. A nanoconverter array, comprising: an array of one or more nanoconverters constructed according to the method of embodiment 33; wherein the nanoconverter array is arranged to generate a specified current output and voltage output when supplied with a heat source applied to the polymer layer.

43. The nanoconverter array of embodiment 42, wherein the nanoconverter array generated specified current output and voltage output is output to one or more of the group of devices consisting of: a cell phone, a smart phone, a glucose monitor, a pacemaker, a therapeutic or diagnostic device, a drug delivery device, an insulin pump, a left ventricular assist device, a cardioverter defibrillator, an artificial muscle device, a cochlear implant, a batteryless device, a powered nanomachine, and an artificial vision device.

44. The nanoconverter array of embodiment 42, wherein the nanostructure array generated specified current output and voltage output is output to an insulin control system, said insulin control system comprising: a nanosensor glucose monitor that produces a sensor voltage proportional to a glucose molecule concentration; a controller that senses the sensor voltage; and an insulin pump controlled by the controller whereby insulin is disseminated when the sensor voltage exceeds a preset level.

45. A nanosensor, comprising: a nanoconverter constructed according to the method of embodiment 33; wherein the nanoconverter operates as a nanosensor to detect a temperature applied to the polymer layer by generating a nanoconverter voltage output.

46. A nanoconverter, comprising: a nanostructure; and means for generating power from the nanostructure from a heat source.

47. The nanoconverter of embodiment 46, wherein the means for generating power from the nanostructure comprises: a polymer layer adhered to the nanostructure in a stress transfer zone; wherein the nanostructure is stressed by the polymer layer in the stress transfer zone to piezoelectrically generate power from the nanostructure.

48. A nanoconverter comprising a nanostructure that interacts with a polymer layer in a stress transfer zone to generate power through a piezoelectric effect.

49. A device powered by the nanoconverter of embodiment 48, wherein the device has no other power source.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Heating Rate And Deformation Strain Rate Of The ZnO Nanowires

| Peltier Heater Voltage (V) | Estimated Heating Rate (° C./s) | Nanowire Strain Rate (/s) |
| --- | --- | --- |
| 2 | 0.07 | $0.54 \times 10^{-5}$ |
| 4 | 0.10 | $0.77 \times 10^{-5}$ |
| 6 | 0.19 | $1.46 \times 10^{-5}$ |
| 8 | 0.29 | $2.23 \times 10^{-5}$ |

What is claimed is:

1. A nanoconverter, comprising:
one or more nanostructures comprising a top end and a bottom end;
wherein the nanostructures are at least partially embedded within a polymer layer; and
means for generating power from the nanostructures;
wherein the means for generating power comprises a top electrode electrically connected to one or more of the nanostructures at the nanostructure top end and; and
wherein the top electrode is deposited on top of the polymer layer.

2. The nanoconverter of claim 1, wherein the means for generating power comprises:
a bottom electrode disposed on bottom end of one or more of the nanostructures; and
a polymer layer into which the nanostructures are embedded.

3. The nanoconverter of claim 1, where the nanostructures are selected from the group of nanocomponents consisting of: a nanotube, a nanowire, a nanosheet, and a nanoribbon.

4. The nanoconverter of claim 1, wherein the nanostructures are selected from the group of nanostructures consisting of: a ZnO nanowire, a silicon nanowire, a carbon nanotube, and a semiconductor nanostructure.

5. The nanoconverter of claim 1, wherein the nanostructures are either aligned or substantially vertically aligned.

6. The nanoconverter of claim 5, wherein the means for generating power comprises a heat source applied to the polymer layer.

7. The nanoconverter of claim 6, wherein the heat source is selected from the group of heat sources consisting of an exhalation, a combustion source, an electronic source, a solar source, and a biological oxidation source.

8. The nanoconverter of claim 7:
wherein the exhalation originates from the group of exhalants consisting of: human breath, non-human animal breath, bacterial outgas, and plant outgas; and
wherein the biological oxidation originates from the group of biological oxidizers consisting of: human metabolism, non-human metabolism, bacterial metabolism, and plant metabolism.

9. The nanoconverter of claim 1, wherein the polymer layer comprises a coefficient of thermal expansion selected from the group of thermal expansions consisting of: $\geq 40 \times 10^{-6}/°K$, $\geq 50 \times 10^{-6}/°K$, $\geq 60 \times 10^{-6}/°K$, $\geq 70 \times 10^{-6}/°K$, and $\geq 80 \times 10^{-6}/°K$.

10. The nanoconverter of claim 1, wherein a ratio of a coefficient of thermal expansion of the polymer layer divided by a coefficient of thermal expansion of the nanostructure comprises a ratio selected from the group of ratios consisting of: $\geq 2.000$, $\geq 3.000$, $\geq 4.000$, $\geq 5.000$, $\geq 6.000$, $\geq 7.000$, $\geq 8.000$, $\geq 9.000$, and $\geq 10.000$.

11. The nanoconverter of claim 10, wherein the coefficient of thermal expansion nanostructure is taken from a c-axis.

12. An array of one or more nanoconverters of claim 1 that forms a nanoconverter array, arranged to generate a specified current and voltage output when supplied with a heat source.

13. The nanoconverter array of claim 12, wherein the heat source is at a temperature between an initial fabrication temperature of the polymer layer and a glass transition temperature $T_g$ of the polymer layer.

14. The nanoconverter array of claim 12, wherein the nanoconverter operates as a nanosensor to detect a temperature by generation of a voltage when the temperature is applied to the polymer layer.

15. The nanoconverter of claim 1, further comprising an environmental sealant that seals the top end of the nanostructure from environmental degradation.

16. The nanoconverter array of claim 12, further comprising:
a device selected from one or more of the group of devices consisting of: a cell phone, a smart phone, a glucose monitor, a pacemaker, a therapeutic or diagnostic device, a drug delivery device, an insulin pump, a left ventricular assist device, a pacemaker, a cardioverter defibrillator, or an artificial muscle device, a cochlear implant, a batteryless device, a powered nanomachine, a smart phone, a calculator, a wrist watch, a standalone sensor, a sensor in a network, and an artificial vision device;
wherein the device is powered by the nanoconverter array.

17. The nanoconverter array of claim 12, further comprising:
an insulin control system, said insulin control system comprising:
 (a) a nanosensor glucose monitor that produces a voltage proportional to a glucose molecule concentration;
 (b) a controller that senses the nanosensor glucose monitor voltage; and
 (c) an insulin pump controlled by the controller whereby insulin is disseminated when the nanosensor glucose monitor voltage is exceeded;
 (d) wherein the insulin pump is powered by the nanoconverter array.

18. The nanoconverter of claim 1, wherein the polymer layer is selected from the group of polymers consisting of: epoxy and poly(vinyl chloride-co-vinyl-co-2-hydroxypropyl acrylate) (PVC).

19. The nanoconverter of claim 1, comprising:
a top electrode that electrically connects to the nanostructure at the nanostructure top end; and
a bottom electrode that electrically connects to the nanostructure at the nanostructure bottom end.

20. A nanoconverter apparatus, comprising:
a nanostructure with top and bottom ends;
a top electrode electrically connected to the top end;
a polymer layer that surrounds at least a portion of the nanostructure;
wherein the top electrode is deposited on the polymer layer;
wherein the surrounded portion of the nanostructure forms a stress transfer zone; and
a bottom electrode electrically connected to the nanostructure at the bottom end of the nanostructure;
wherein the nanostructure generates a piezoelectric voltage and a current when the polymer layer exerts a stress on the nanostructure in the stress transfer zone.

21. The nanoconverter apparatus of claim 20, wherein the nanostructure is selected from the group of nanocomponents consisting of: a nanotube, a nanowire, a nanosheet, and a nanoribbon.

22. The nanoconverter apparatus of claim 20, wherein the nanostructure is selected from the group of nanostructures consisting of: a ZnO nanowire, a silicon nanowire, a carbon nanotube, and a semiconductor nanostructure.

23. The nanoconverter apparatus of claim 20, wherein the nanostructure is an element of an aligned or substantially vertically aligned forest of nanostructures.

24. The nanoconverter apparatus of claim 20, wherein the nanostructure generates the piezoelectric voltage and the current through stress induced on the nanostructure by the polymer layer in the stress transfer zone.

25. The nanoconverter apparatus of claim 24, wherein the polymer layer exerts the stress induced on the nanostructure from a heat source comprising an exhalation.

26. The nanoconverter apparatus of claim 25, wherein the exhalation originates from the group of exhalants consisting of: human breath, non-human animal breath, bacterial outgases, and plant outgases.

27. A nanoconverter array, comprising:
an array of one or more nanoconverters of claim 20;
wherein the nanoconverters are arranged to generate a specified current output and voltage output when a heat source is supplied to the polymer layers of the nanoconverters.

28. The nanoconverter array of claim 27, wherein the nanoconverter operates as a nanosensor to detect a temperature by generation of the piezoelectric voltage output.

29. The nanoconverter array of claim 27, wherein the nanostructure generated piezoelectric voltage and current outputs power to one or more of the group of devices consisting of: a cell phone, a smart phone, a glucose monitor, a pacemaker, a therapeutic or diagnostic device, a drug delivery device, an insulin pump, a left ventricular assist device, a pacemaker, a cardioverter defibrillator, or an artificial muscle device, a cochlear implant, a batteryless device, a powered nanomachine, and an artificial vision device.

30. The nanoconverter array of claim 27, further comprising:
an insulin control system, said insulin control system comprising:
 (a) a nanosensor glucose monitor that produces a voltage proportional to a glucose molecule concentration;
 (b) a controller that senses the nanosensor glucose monitor voltage; and
 (c) an insulin pump controlled by the controller whereby insulin is disseminated when the nanosensor glucose monitor voltage is exceeded;
 (d) wherein the insulin pump is powered by the array of one or more nanoconverters.

31. The nanoconverter apparatus of claim 20, wherein the polymer layer is selected from the group of polymers consisting of: epoxy and poly(vinyl chloride-co-vinyl-co-2-hydroxypropyl acrylate) (PVC).

* * * * *